United States Patent
Yoshikawa et al.

(10) Patent No.: US 8,340,787 B2
(45) Date of Patent: Dec. 25, 2012

(54) MONITORING AND CONTROL DEVICE

(75) Inventors: Keisuke Yoshikawa, Nishinomiya (JP); Tomoaki Sasaki, Tsu (JP); Katsuhiko Kimura, Hirakata (JP); Kei Miura, Tsu (JP); Akihiro Hiroishi, Osaka (JP); Satoshi Kitamura, Shijonawate (JP); Yulchiro Naoi, Katano (JP); Mototsugu Kawamata, Tsu (JP); Yuichi Yoshimura, Hirakata (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 12/656,213

(22) Filed: Jan. 21, 2010

(65) Prior Publication Data
US 2010/0182262 A1    Jul. 22, 2010

(30) Foreign Application Priority Data

Jan. 21, 2009 (JP) ................. 2009-011132
Jan. 28, 2009 (JP) ................. 2009-017104
Feb. 12, 2009 (JP) ................. 2009-030178
Feb. 24, 2009 (JP) ................. 2009-041511
Mar. 26, 2009 (JP) ................. 2009-077689

(51) Int. Cl.
*G05B 11/01* (2006.01)
*G05B 15/00* (2006.01)
*G06F 3/00* (2006.01)

(52) U.S. Cl. ............................ 700/17; 700/83; 715/700
(58) Field of Classification Search ................... 700/17, 700/83; 715/700
See application file for complete search history.

(56) References Cited

U.S. PATENT DOCUMENTS

| 5,008,662 | A | | 4/1991 | Tokizane et al. |
| 5,455,505 | A | * | 10/1995 | Laplace et al. ................. 323/343 |
| 5,515,303 | A | * | 5/1996 | Cargin et al. ............ 361/679.32 |
| 5,642,290 | A | * | 6/1997 | Reilly et al. ................... 700/298 |
| 6,967,565 | B2 | * | 11/2005 | Lingemann ................ 340/12.23 |
| 8,024,073 | B2 | * | 9/2011 | Imes et al. .................... 700/276 |
| 2004/0027006 | A1 | | 2/2004 | Kuroiwa |

(Continued)

FOREIGN PATENT DOCUMENTS

JP     H06-247217     9/1994

(Continued)

OTHER PUBLICATIONS

The Office Action dated Jan. 18, 2011 for the counterpart Japanese application No. 2009-077689 and the English summary thereof.

(Continued)

*Primary Examiner* — Ronald Hartman, Jr.
(74) *Attorney, Agent, or Firm* — Bacon & Thomas, PLLC

(57) ABSTRACT

In a monitoring and control device for use in a remote monitoring and control system, a device housing has a socket located behind a display panel and an external storage medium including a rewritable memory is removably mounted in the socket. The device housing is attached in an attachment hole formed in a wall in a state that the external storage medium is mounted in the socket. A control unit performs a setting operation for a graphic image displayed on the display panel and for the load control in accordance with setting information stored in the external storage medium. The external storage medium is inserted in the socket through an insertion slot formed in a side portion of the device housing, at least a portion of the insertion slot being received in the attachment hole in a state that the device housing is attached to the wall.

26 Claims, 26 Drawing Sheets

U.S. PATENT DOCUMENTS

| | | |
|---|---|---|
| 2007/0139021 A1 | 6/2007 | Kojima et al. |
| 2009/0027419 A1* | 1/2009 | Kondo et al. ................. 345/649 |
| 2010/0145611 A1 | 6/2010 | Tokue et al. |
| 2011/0106320 A1* | 5/2011 | Hall ............................. 700/284 |
| 2011/0270448 A1* | 11/2011 | Kantor et al. ................. 700/284 |

FOREIGN PATENT DOCUMENTS

| | | |
|---|---|---|
| JP | H06-266472 | 9/1994 |
| JP | H07-046670 | 2/1995 |
| JP | H07-212851 | 8/1995 |
| JP | 10-243478 | 9/1998 |
| JP | 2000-207071 A | 7/2000 |
| JP | 2004-088514 | 3/2004 |
| JP | 2004-127167 A | 4/2004 |
| JP | 2005-100070 | 4/2005 |
| JP | 2005-165745 | 6/2005 |
| JP | 2007-172222 | 7/2007 |
| JP | 2008-178077 | 7/2008 |
| JP | 2008-298765 A | 12/2008 |
| KR | 10-1989-0007601 | 6/1989 |
| KR | 10-1999-0074956 | 10/1999 |

OTHER PUBLICATIONS

The Office Action dated Nov. 24, 2010 for the counterpart Japanese application No. 2009-030178 and the English summary thereof.
The Office Action dated Jun. 28, 2011 for the counterpart Japanese application No. 2009-030178 and the English summary thereof.
The Korean Office Action dated May 9, 2011 and English summary thereof.
Japanese Office Action in corresponding Japanese Application No. 2009-017104, dated Oct. 16, 2012 with English abstract thereof.

* cited by examiner

MONITORING AND CONTROL DEVICE

FIELD OF THE INVENTION

The present invention relates to a monitoring and control device for use in a remote monitoring and control system that performs monitoring and control of a load through communication.

BACKGROUND OF THE INVENTION

Conventionally, there are known remote monitoring and control systems for performing remote monitoring and control of a load, in which a transmission signal containing switch on-off information is transmitted through a signal line and in which a relay for turning on or off the electric power supplied to the load is opened and closed by the transmission signal.

One example of these remote monitoring and control systems is a centralized control system that includes a terminal device formed of an operation terminal having a switch and a control terminal having a relay for turning on or off the electric power supplied to a load and a central device formed of a transmission unit. Each of the operation terminal and the control terminal may be provided in plural numbers. The transmission unit, the operation terminal and the control terminal are connected to a two-wire type signal line. The transmission unit recognizes the operation terminal and the control terminal by using the terminal addresses individually allotted to the operation terminal and the control terminal.

The transmission unit includes a memory that stores a control table as a data table in which the operation terminals and the control terminals are mated with each other by the addresses. If the information on an on-off operation of a switch belonging to any one of the operation terminals is notified through the use of a transmission signal (e.g., a time-division multiplexed transmission signal), the transmission unit transmits a relay-opening or relay-closing command through the transmission signal to the control terminal which is mated with the operation terminal in the control table. Responsive to this command, the control terminal opens or closes the relay thereof. Thus, the switch of the operation terminal is turned on or off to thereby control the load.

In this regard, it is typical that each of the operation terminals includes a plurality of switches and that a plurality of loads are connected to each of the control terminals. In the control table of the transmission unit, the switches and the loads are mated with each other on a circuit-by-circuit basis. In a hypothetical case where there exists only a terminal address specific to each of the operation terminals even when the latter includes a plurality of switches, the terminal address would cover all of the switches provided in each of the operation terminals. This makes it impossible to specify one of the switches to be actually operated. For that reason, different load numbers are allotted to the respective switches in each of the operation terminals, and the terminal addresses of the operation terminals added with the load numbers at their ends are used as switch addresses. By doing so, it is possible to specify one of the switches to be actually operated. Similarly, different load numbers are allotted to the loads in each of the control terminals, and the terminal addresses of the control terminals added with the load numbers at their ends are used as load addresses. In addition, the plurality of loads connected to each of the control terminals may constitute a single load circuit, in which case the terminal address of each of the control terminals is used as a load address.

In the control table, the switches and the loads can be mated with each other not only in a one-to-one correspondence relationship but also in a one-to-multiple correspondence relationship. For example, in case where the remote monitoring and control system turns on or off the electric power supplied to illumination devices as the loads, it is possible for the transmission unit to set individual control by which the illumination devices of a single circuit are turned on or off with a single switch and collective control by which the illumination devices of a plurality of circuits are collectively turned on or off with a single switch. In other words, the individual control means that the loads belonging to a single circuit are controlled by one instruction, whereas the collective control means that the loads belonging to a plurality of circuits are controlled by one instruction. The collective control is divided into group control and pattern control. In the group control, the ranges of the loads to be controlled are preliminarily mated with switches, and the loads belonging to each of the ranges are collectively turned on or off by operating one of the switches. In the pattern control, the ranges of the addresses of the loads to be controlled and the on-off conditions of the loads corresponding to the respective addresses are preliminarily mated with switches, and the loads belonging to each of the ranges are individually turned on or off by operating one of the switches.

In order to perform the group control or the pattern control set forth above, the group numbers or the pattern numbers corresponding to the switches for performing the group control or the pattern control are mated with the addresses of the loads to be controlled, in the control table of the transmission unit. Upon operating one of the switches for performing the group control or the pattern control, the transmission unit checks up the control table, extracts the addresses of the loads to be controlled and determines the on-off conditions of the loads. Thereafter, the transmission unit issues an instruction to the control terminal having the address identified by checking up the control table.

When one wishes to control the operations of loads in a place, e.g., a meeting room, where there exists a plurality of loads, it is necessary to use a plurality of switches. This poses a problem of increasing the space occupied by an operation terminal. In this connection, use of the group control or the pattern control makes it possible to control the operations of loads with a single switch. However, the loads to be collectively controlled need to be set in advance in order to perform the group control, and the operation conditions of the loads need to be set in advance in order to perform the pattern control. This necessitates use of an operation unit for performing the setting noted above, consequently increasing the number of switches required and increasing the space occupied by the operation terminal.

As an operation terminal used in the remote monitoring and control system described above, there has been proposed a monitoring and control device (see, e.g., Japanese Patent Laid-open Publication No. 10-243478 (JP10-243478A)) that includes a device body, a display panel arranged in the device body and formed of a liquid crystal display, and an operation input unit arranged in the device body and formed of a transparent touch switch superimposed on the screen of the display panel. The monitoring and control device performs load control in response to the operation input of the operation input unit associated with the display content of the display panel and also performs screen display indicative of the load conditions. The device body of the monitoring and control device is attached to a wall. The device body includes a rear portion held inside an attachment hole defined in the wall and a front portion protruding forwards from a wall surface.

The monitoring and control device is configured such that it is possible to set the display content of the display panel (namely, the screen display) and the response to the operation of the operation input unit (namely, the load control). Therefore, the operation input unit can be given a wide variety of functions depending on the content of setting. Since the functions of the operation input unit and the display content of the display panel are changeable, it is possible to perform multi-purpose operations within a limited space and to reduce the space occupied by the operation terminal even when operating a plurality of loads.

Furthermore, the monitoring and control device is capable of changing over an operation mode in which the loads are controlled in response to the operation of the operation input unit associated with the display content of the display panel and a setting mode in which the display content of the display panel and the response to the operation of the operation input unit are set. By operating the monitoring and control device in the setting mode, it is possible to set the display content of the display panel and the load control (namely, the content of the group control or the pattern control).

If a long period of time is taken in performing the aforementioned setting at a job site where the monitoring and control device is installed, it may sometimes hinder the tasks of other workers working at that job site. Therefore, there exists a need to quickly finish the setting task at the job site. For example, there may be an instance where a plurality of remote monitoring and control systems provided with monitoring and control devices partially differing from one another is installed in the respective floors of a building. In order to perform different kinds of setting by operating the monitoring and control devices in the afore-mentioned manner, there is a need to repeatedly perform the same setting task for the respective monitoring and control devices. This reduces the efficiency of the setting task.

Meanwhile, the monitoring and control device of this kind may be configured to have a body unit fixed to a wall and a panel unit removably attached to the front side of the body unit. The body unit includes a power supply circuit and a communication circuit to which a signal line is connected. The panel unit includes the display panel, the operation input unit and a control unit. With this configuration, the panel unit has a connector electrically connected to a connector provided on the front side of the body unit. When attached to the body unit, the panel unit is operated by an electric current supplied from the power supply circuit through the connectors of the body unit and the panel unit. This configuration makes it possible to independently replace the body unit and the panel unit with a new one. For example, a monitoring and control device with a display panel differing in screen size can be provided by replacing only the panel unit.

With the monitoring and control device in which the body unit and the panel unit are divided as set forth above, the body unit to which a power supply line and a signal line have been connected in advance are fixed to a wall when installing the monitoring and control device or replacing the body unit or the panel unit. Then, the panel unit is attached to the body unit which remains in a current-supplying state. For that reason, when the panel unit is attached to the body unit, the contact members of the connectors of the body unit and the panel unit may come into contact with each other in a state that the connectors of the body unit and the panel unit are out of alignment. Thus, an abnormal current may flow through the connectors of the body unit and the panel unit. In addition, the contact members of one of the connectors may make contact with the contact members of the other at different time. This may generate a time lag in the timing at which an electric current begins to be supplied to the respective circuits. As a result, there is a possibility that failure or other trouble may occur in the body unit or the panel unit.

In an effect to prevent occurrence of the trouble, it may be thinkable to employ a configuration in which an operating member of a mechanical switch for detecting attachment of the panel unit is provided on the surface of the body unit opposed to the panel unit so that, upon attaching the panel unit, the mechanical switch is turned on to start power supply to the panel unit. However, such a movable part as the operating member of the mechanical switch makes the structure of the body unit complicated. The surface of the body unit opposed to the panel unit can be effectively used in many different ways by providing, e.g., function-extension terminals, on the surface. However, if the operating member of the mechanical switch is provided on the surface, the effectively usable space is reduced in proportion to the volume of the operating member.

With the configuration described above, the panel unit is sometimes removed from the body unit for maintenance of the monitoring and control device or other purposes. Removal of the panel unit from the body unit releases connection between the connectors, consequently stopping supply of electric power from the power supply circuit of the body unit to the panel unit. At this time, it is often the case that a noise such as a surge current or the like is generated. Therefore, if the panel unit is removed from the body unit during operation of the panel unit, e.g., when a CPU arranged within the panel unit is storing data in a storage region of a flash memory or the like, the CPU may possibly suffer from failure or other trouble which would be caused by a noise such as a surge current or the like.

Since the display panel formed of a liquid crystal display is used in the operation terminal disclosed in JP10-243478A, it is necessary to employ an internal power supply whose capacity is greater than that of the internal power supply of the operation terminal provided with a switch. In order to secure the internal power supply, there is a need to use a remote-controlled transformer which is arranged within a housing of a power distribution board or the like. Thus, the power distribution board needs to have a space for accommodating the remote-controlled transformer. This poses a problem of increasing the size of the power distribution board. In addition, a power supply line through which an electric current (AC 100V) is inputted to the remote-controlled voltage transformer needs to be inserted into the power distribution board. This leads to a problem of increasing the number of installation steps.

In addition, the monitoring and control device (or the multi-function switch) disclosed in JP10-243478A has a configuration in which, as shown in FIG. 26, the panel unit 2020 having a liquid crystal display (not shown) and a touch switch (not shown) is removably attached to the front surface of the body unit 2010 fixed to a wall through an attachment member (not shown).

Referring to FIG. 27, the body unit 2010 and the panel unit 2020 are electrically connected to each other by a flat cable 2056 and also joined together by drop-preventing ropes 2057 so that, even when the panel unit 2020 is separated from the body unit 2010, the panel unit 2020 can be prevented from colliding with the floor and eventually suffering from damage.

Since the body unit 2010 and the panel unit 2020 are joined together by the drop-preventing ropes 2057 in the monitoring and control device disclosed in JP10-243478A, a great deal of effort is required to perform the task of attaching the monitoring and control device to the wall. In addition, the drop-preventing ropes 2057 need to be removed from the panel unit 2020 when performing maintenance, e.g., checkup or repair, of the panel unit 2020. Therefore, the maintenance work requires a great deal of effort.

SUMMARY OF THE INVENTION

In view of the above, the present invention provides a monitoring and control device that makes it possible to perform a setting task with an external storage medium having a rewritable memory therein, thereby permitting duplication of the setting information and enhancing the efficiency of the setting task, and that can prevent the external storage medium from being removed and inserted during a normal state, thereby avoiding occurrence of a change in the stored setting which would otherwise occur if the external storage medium can be removed and inserted with ease.

Further, the present invention provides a monitoring and control device that can dispense with a mechanical switch for detecting attachment of a panel unit while suppressing occurrence of trouble when the panel unit is attached to a body unit.

In addition, the present invention provides a monitoring and control device capable of stopping supply of an electric current to a panel unit prior to removing the panel unit, thereby avoiding occurrence of failure or other trouble which would otherwise be caused by a noise such as a surge current or the like when the panel unit is removed from a body unit.

Moreover, the present invention provides a monitoring and control device for a remote monitoring and control system capable of reducing the size of a power distribution board and the number of installation steps.

Furthermore, the present invention provides a monitoring and control device capable of preventing drop of a panel unit and allowing installation and maintenance tasks to be performed with ease.

In accordance with an aspect of the present invention, there is provided a monitoring and control device for use in a remote monitoring and control system that monitors and controls loads through communications, the device including: a display panel for displaying a graphic image on a screen thereof; an operation input unit through which a user carries out input operation; a control unit for performing a load control in accordance with the input operation of the user related to the graphic image displayed on the display panel and for allowing the display panel to display the graphic image in accordance with states of the loads; a communication circuit for transmitting a load control signal; a device housing having a socket located behind the display panel, an external storage medium including a rewritable memory being removably mounted in the socket and the device housing being attached in an attachment hole formed in a wall in a state that the external storage medium is mounted in the socket, wherein the control unit performs a setting operation for the graphic image displayed on the display panel and for the load control in accordance with setting information stored in the external storage medium; and wherein the external storage medium is inserted in the socket through an insertion slot formed in a side portion of the device housing, at least a portion of the insertion slot being received in the attachment hole in a state that the device housing is attached to the wall.

With such configuration, the setting task regarding the screen display of the display panel and the load control can be performed by inserting the external storage medium into the socket, which enhances the efficiency of the setting task performed at a job site. At least a portion of the storage medium insertion hole is opened within the attachment hole of the wall. This makes it impossible to insert or remove the external storage medium in a normal state that the body unit is fixed to the wall, thereby preventing a user from inserting or removing the external storage medium with ease.

In accordance with a second aspect of the present invention, the body unit includes a body-side connector provided at the front surface thereof and the panel unit includes a panel-side connector provided opposite to the body-side connector, the body unit and the panel unit being electrically connected to each other by connecting the body-side connector with the panel-side connector, wherein the panel unit is supplied with the power from the power supply circuit through the connectors when it is coupled with the body unit, and the body unit further includes at least one detection power source for supplying an electric current to at least one detection circuit connected to the panel-side connector when the connectors are connected to each other, a detection unit that detects the connection between the connectors when a potential at a connection point between the detection power source and the body-side connector is changed by the current flowing through the detection circuit, and a power supply control unit that turns on the power supply to the panel unit when the detection unit detects the connection between the connectors.

With such configuration, when the detection unit detects the connection between the body-side connector and the panel-side connector, the power supply control unit begins to supply the power to the panel-side connector. Accordingly, if the panel unit is attached to the body unit without connecting the connectors, it is possible to ovoid occurrence of the trouble even when the contact members of the connectors are erroneously connected to each other.

In accordance with a third aspect of the present invention, the body unit includes a body-side connector provided at the front surface thereof and the panel unit includes a panel-side connector provided opposite to the body-side connector and an ending operation part, the body unit and the panel unit being electrically connected to each other by connecting the body-side connector with the panel-side connector, wherein the panel unit is supplied with a power from the power supply circuit through the connectors when it is coupled with the body unit, and wherein the body unit further includes a power supply control unit that turns off the power supply to the panel unit in response to the operation of the ending operation part when the panel unit is attached to the body unit.

With such configuration, the power supply control unit stops the power supply to the panel unit in response to the operation of the ending operation part, so that it is possible to ovoid occurrence of the trouble that would occur when the panel-side connector is disconnected from the body-side connector while the power is supplied to the panel unit.

In accordance with a fourth aspect of the present invention, the display panel displays operation buttons on the screen thereof, the operation input unit receives the input operation using the operation buttons, a transmission communication unit transmits a transmission signal including monitoring data in response to the input operation, and the power supply circuit includes a first power supply circuit generating an internal electric power from the transmission signal transmitted through a signal line, a second power supply circuit generating the internal electric power from the power supplied through a remote-controlled transformer provided at the outside and a changeover unit for selecting one of the first and the second power supply circuit.

With the present embodiment, the internal electric power required in the monitoring and control device can be generated from the transmission signal inputted through the signal line, if a small amount of electric current is consumed by other terminals than the monitoring and control device connected to the same signal line. In this case, it becomes unnecessary to employ the remote-controlled transformer for supplying electric power to the monitoring and control device. As a result, there is no need to provide the space for accommodating the remote-controlled transformer and to perform the task of extending the power supply line into the remote-controlled transformer. This makes it possible to reduce the size of the power distribution board and the number of installation steps. Even if an increased amount of electric current is consumed by other terminals than the monitoring and control device connected to the same signal line Ls and even if the internal electric power required in the monitoring and control device cannot be generated from the transmission signal inputted through the signal line, it is possible to easily select the remote-controlled transformer by operating the changeover switch so that the electric power can be supplied from the remote-controlled transformer. Even if the power supply line is not extended into the remote-controlled transformer when the existing system is replaced by the monitoring and control device, the replacement task can be easily performed by operating the changeover switch to select the power supply from the transmission signal.

In accordance with a fifth aspect of the present invention, the monitoring and control device further includes: a plate frame having a front plate portion with a window through which the front surface of the panel unit is exposed and a peripheral holder piece arranged to surround and hold a peripheral surface of the panel unit extending perpendicular to the front surface thereof, the plate frame being fixed in place to the wall surface; and a plate cover having a front wall portion that covers the front plate portion and has a cover window through which the front surface of the panel unit is exposed, and a peripheral wall portion arranged to surround the peripheral holder piece of the plate frame, the plate cover being fitted to the plate frame from the front side thereof, wherein the cover window has a size that allows the panel unit to be fitted in the window with substantially no gap therebetween, and at least one drop-preventing leg is provided on the peripheral surface of the panel unit.

With such configuration, even if when the locking claws are removed from the locking holes, the drop-preventing lugs 1025 is brought contact with the front wall portion of the plate cover, thereby preventing the panel unit from being dropped. Further, the panel unit is detachably attached to the front surface of the body unit from the front side and the plate cover is attached to the plate frame. This makes the installation works easy. In addition, the panel unit can be separated from the body unit by merely detaching the plate cover from the plate frame and drawing out the panel unit forwardly. This makes easy the maintenance of the panel block such as checking or repairing.

DETAILED DESCRIPTION OF THE PREFERRED EMBODIMENTS

Hereinafter, monitoring and control devices in accordance with embodiments of the present invention will be described with reference to the accompanying drawings.

Each of the monitoring and control devices described below is used as an operation terminal in the remote monitoring and control system shown in FIG. 2. The basic configuration of the remote monitoring and control system is the same as that of the remote monitoring and control system described in the section of Background of the Invention.

Figure 2:
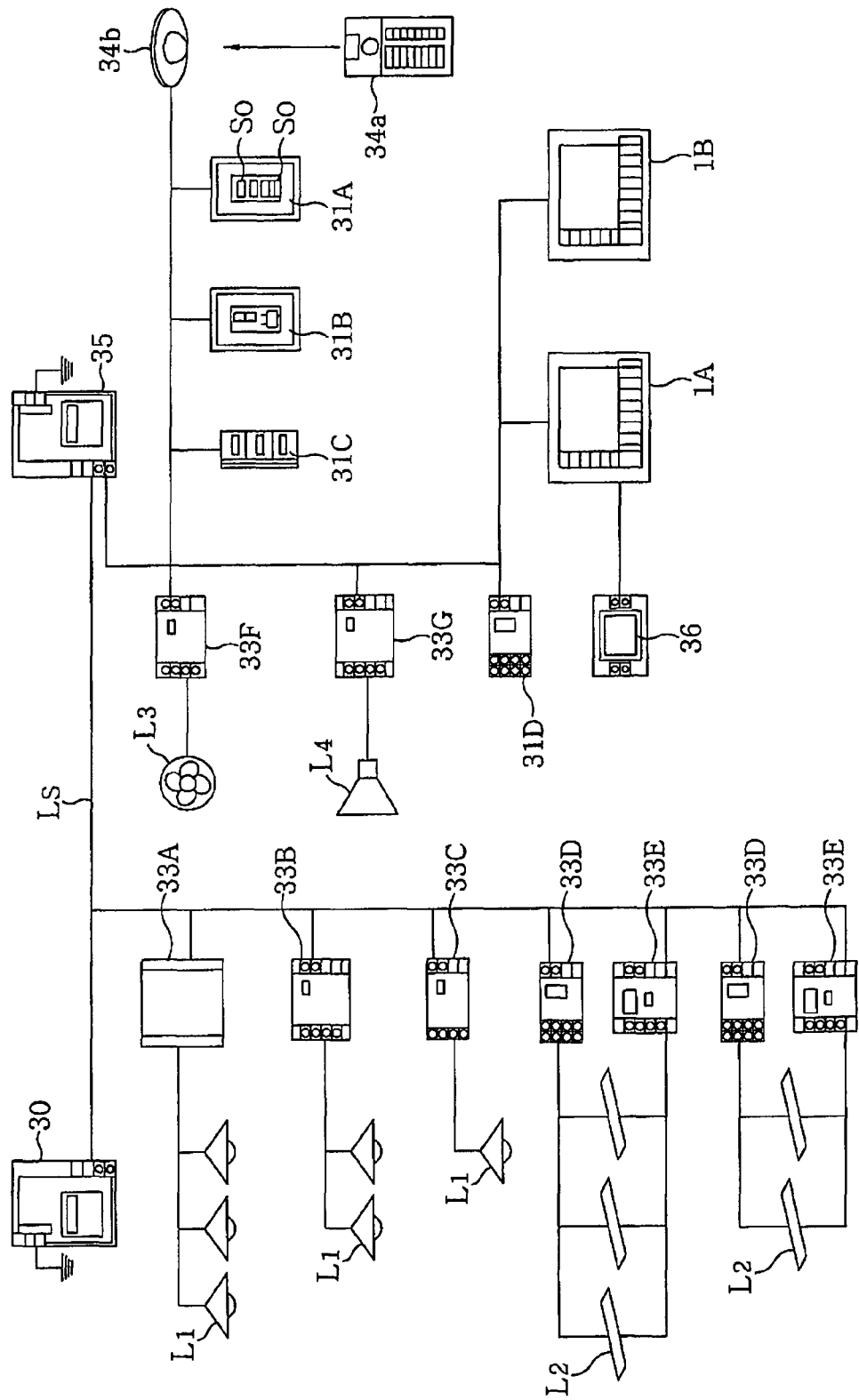
FIG. 2 is a diagram showing a remote monitoring and control system that makes use of the monitoring and control device.

More specifically, the remote monitoring and control system shown in FIG. 2 includes, as loads, incandescent lamps L1, fluorescent lamps L2 each having an inverter-type lighting device, a fan coil L3 for an air conditioner, and a speaker L4. The incandescent lamps L1 are controlled by incandescent-lamp-dimming control terminals 33A, 33B and 33C whose capacities (1500 W, 800 W and 500 W) depend on the number of lamps. The fluorescent lamps L2 are controlled by control terminals 33D, each of which has a relay for controlling the lighting and extinction of the fluorescent lamps L2, and by fluorescent-lamp-dimming control terminals 33E for controlling the output power of light. The fan coil L3 is controlled by a fan coil control terminal 33F so that it can operate in one of three operation magnitudes, namely strong, middle and weak magnitudes. The volume of the speaker L4 is controlled by a volume control terminal 33G. Other examples of the loads include an electric curtain, an electric screen and a ventilation fan.

The remote monitoring and control system includes an operation terminal 31A provided with switches S0, a couple of dimming operation terminals 31B and 31C, and a contact point input operation terminal 31D to which various kinds of sensors capable of producing contact point outputs are connected. In addition, it is possible to provide an additional operation terminal by combining a wireless transmitter 34a having an operation portion with a wireless receiver 34b. In the illustrated example, a repeater (or an amplifier) 35 is arranged on a signal line Ls so that a transmission signal can be transmitted with no attenuation. In the illustrated example, two monitoring and control devices 1A and 1B serving as operation terminals are connected to the remote monitoring and control system (Hereinafter, the monitoring and control devices 1A and 1B will be simply referred to as "monitoring and control device 1" if there is no need to distinguish them from each other). The monitoring and control device 1A is supplied with electric power of AC 24V from a remote-controlled transformer 36, i.e., a voltage-reducing transformer, for reducing the voltage of commercial power (of, e.g., AC 100V) and outputting electric power of reduced voltage. In the following description, the operation terminals 1A, 1B, 31A and 31D will be simply referred to as "operation terminal 31" if there is no need to distinguish them from one another. Likewise, the control terminals 33A to 33G will be simply referred to as "control terminal 33" if there is no need to distinguish them from each other.

The remote monitoring and control system further includes a transmission unit 30 for periodically sending a transmission signal through the signal line Ls. Used as the transmission signal is, e.g., a bipolar pulse-width-modulation signal of 24V. In the operation terminal 31 and the control terminal 33 other than the monitoring and control device 1, the transmission signal is full-wave rectified to secure internal electric power. The transmission unit 30 is supplied with commercial power.

Brief description will now be made on the operation of the remote monitoring and control system.

The transmission unit 30 performs normal polling by which a transmission signal carrying terminal addresses changed to cyclic codes is periodically transmitted to the signal line Ls normally. Used as the transmission signal is a bipolar signal that contains a start pulse indicative of the startup of signal transmission, mode data indicative of a signal mode, address data carrying a terminal address used in specifically calling the operation terminal 31 or the control terminal 33, control data (including a load number) used in controlling the loads L, checksum data used in detecting a transmission error, and data on a signal return period, i.e., a time slot, within which a return signal is to be received from the operation terminal 31 or the control terminal 33.

If a monitoring input is generated in the operation terminal 31 through the operation of a switch, the operation terminal 31 transmits to the signal line Ls an interrupt signal synchronized with the start pulse of the transmission signal. The operation terminal 31 that has generated the interrupt signal comes into a latch state in which an interrupt flag is set. Upon detecting the interrupt signal, the transmission unit 30 transmits a transmission signal whose mode data is set in a search mode. Responsive to the transmission signal of search mode, the operation terminal 31 kept in the latch state returns a terminal address to the transmission unit 30 within a signal return period. Upon receiving the terminal address, the transmission unit 30 sends a transmission signal that requests the operation terminal 31 matched with the terminal address to send back information on the latch state. By confirming the latch state, the transmission unit 30 determines that the operation terminal 31 has generated the interrupt signal. Upon making this determination, the transmission unit 30 sends to the operation terminal 31 a transmission signal for releasing the latch state, thereby releasing the operation terminal 31 from the latch state.

Upon receiving the request from the operation terminal 31 through the operation set forth above, the transmission unit 30 requests the control terminal 33 mated with the operation terminal 31 in the control table to control the load L. Then, the transmission unit 30 sends to the control terminal 33 a transmission signal for determining the status of the load L to be controlled and receives information on the load status from the control terminal 33. The information on the load status received from the control terminal 33 is determined by the transmission unit 30. If the load L is currently in an off-state, the transmission unit 30 sends to the operation terminal 31 and the control terminal 33 a transmission signal for bringing the load into an on-state. The reason for sending the transmission signal even to the operation terminal 31 is to ensure that the change of the load status is reflected in the indication of an on-off indicator lamp provided in the operation terminal 31. In response to the transmission signal, the control terminal 33 sends a reception confirmation signal back to the transmission unit 30.

In the remote monitoring and control system described above, if the switch S0 of the operation terminal 31 is operated, the transmission unit 30 collates the address of the switch S0 (i.e., the terminal address plus the load number) with the control table and sends a transmission signal instructing control of the load L to the control terminal 33 connected to the load L mated with the switch S0. This operation makes it possible to reflect the on-off information of the switch S0 in the control of the load L.

First Embodiment

Figure 3:
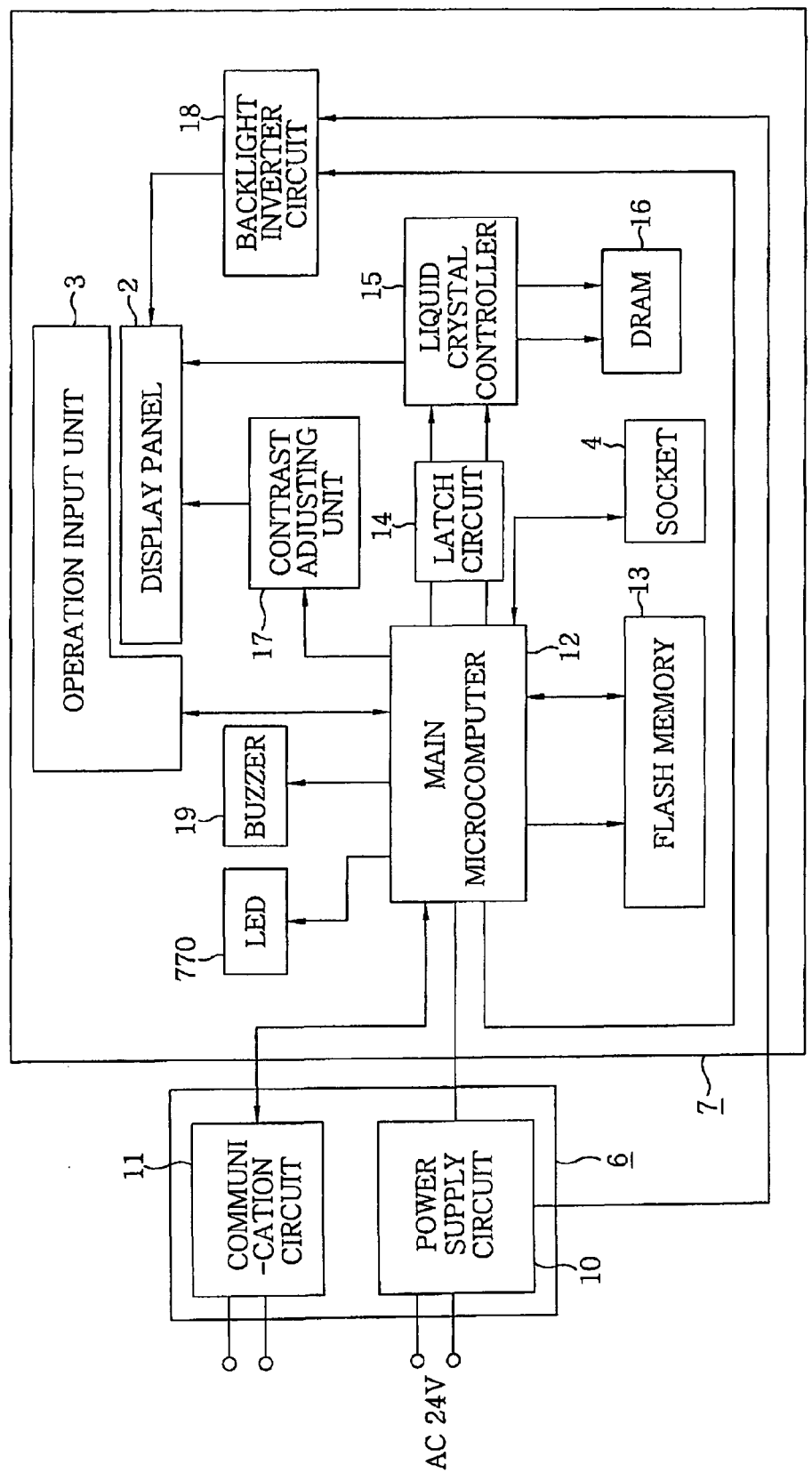
FIG. 3 is a schematic block diagram of the monitoring and control device.

Referring to FIG. 3, the monitoring and control device of the present embodiment includes a display panel 2 formed by combining a backlight with a liquid crystal display, and an operation input unit 3 formed of a transparent flat touch switch superimposed on the screen (or the front surface) of the display panel 2. The display panel 2 is of a matrix display type in which a multiplicity of pixels is arranged in a matrix pattern. A pictorial figure is represented by the combination of pixels. The operation input unit 3 includes a transparent sheet member and a plurality of transparent electrode contact points arranged on the sheet member. The operation input unit 3 is a resistance-pressure-sensitive touch switch that outputs a signal indicating the point on the sheet member touched by a finger or the like. The display panel 2 and the operation input unit 3 cooperate to form a touch panel display.

The monitoring and control device 1 further includes a communication circuit 11 connected to the transmission unit 30 through the signal line Ls for sending and receiving a transmission signal (or a communication command). The communication circuit 11 is connected to a main microcomputer 12 serving as a control unit. The main microcomputer 12 operates according to the program and data stored in a flash memory 13 as a built-in memory of the monitoring and control device 1. At least the address of the operation terminal 31 is stored in the flash memory 13. In addition, the flash memory 13 is provided with at least a storage region for storing the setting information which is set by using an external storage medium to be described below.

The main microcomputer 12 outputs the data indicative of the display content of the display panel 2 to a liquid crystal controller 15 through a latch circuit 14. The liquid crystal controller 15 displays a specified content in a predetermined position of the display panel 2 using the data preliminarily registered in a DRAM 16. The contrast of the display panel 2 and the brightness of the backlight are automatically adjusted by a contrast adjusting unit 17 and a backlight inverter circuit 18, both of which are controlled by the main microcomputer 12. The main microcomputer 12 has a function of activating a buzzer 19 in response to the operation of the operation input unit 3.

The monitoring and control device 1 of the present embodiment includes a socket 4 into which is removably inserted a memory card MC (see FIG. 5) as an external storage medium including SD memory card (registered trademark). The main microcomputer 12 performs communication with the memory card MC mounted in place, thereby making it possible to transmit the content stored in the memory card MC to the flash memory 13. The setting information on the screen display of the display panel 2 and the load control is pre-stored in the memory card MC. The setting information is transmitted to the flash memory 13 so that the main microcomputer 12 can perform the screen display and the load control based on the setting information.

In other words, if the memory card MC is mounted in the socket 4, the main microcomputer 12 automatically performs the setting on the screen display of the display panel 2 and the load control according to the setting information stored in the memory card MC. Once the setting comes to an end (or if the setting information is completely transmitted to the flash memory 13), the operation of the monitoring and control device 1 is not affected by the subsequent removal of the memory card MC. Needless to say, the monitoring and control device 1 may be used while the memory card MC is kept mounted in the socket 4.

The kinds of the setting that can be performed using the memory card MC include, e.g., the setting of the group control or the pattern control described in the section of Background of the Invention (namely, the setting of the loads L to be collectively controlled in the group control or the setting of the state of the loads L to be controlled in the pattern control), the setting of the schedule control by which the loads L are controlled in respect of the time, and the setting of various kinds of information to be displayed on the display panel 2. In case where a simple map of the building employing the remote monitoring and control system is displayed on the display panel 2 and the monitoring operation of the loads L is performed using the symbols on the map indicating the loads L, the map data can be used as the setting information. In addition, the setting of a password and the initial setting of presence or absence of an operation sound of the operation input unit 3 can be performed using the memory card MC.

The setting content to be reflected in the control table of the transmission unit 30, such as the setting on the group control or the pattern control, is transmitted from the communication circuit 11 to the transmission unit 30 through the signal line Ls. In other words, the mating relationship between the switches S0 and the loads L is managed by the control table of the transmission unit 30. Therefore, the transmission unit 30 can change the control table to reflect the setting content set by the monitoring and control device 1.

The storage of the setting information in the memory card MC and the preparation of the setting information can be performed by a general-purpose personal computer using dedicated software. The setting information is transmitted from the memory card MC to the flash memory 13. Through the operation of the operation input unit 3, it is also possible to transmit the setting information from the flash memory 13 to the memory card MC.

By preliminarily preparing the setting information in an office or other places and storing the setting information in the memory card MC, it is possible for an installation worker to perform various kinds of setting by merely mounting the memory card MC in the socket 4 of the monitoring and control device 1. This helps enhance the efficiency of the setting task to a greater extent than when the setting task is performed by operating the monitoring and control device 1 at a job site. In an instance where a plurality of remote monitoring and control systems is installed in the respective floors of a building, a partially different setting task is performed with respect to a plurality of monitoring and control devices 1. At this time, if the setting for one of the monitoring and control devices 1 comes to an end, the setting information is duplicated and transferred to another monitoring and control device through the use of the memory card MC. This makes it possible to greatly reduce the time required in performing the setting task.

Figure 4:
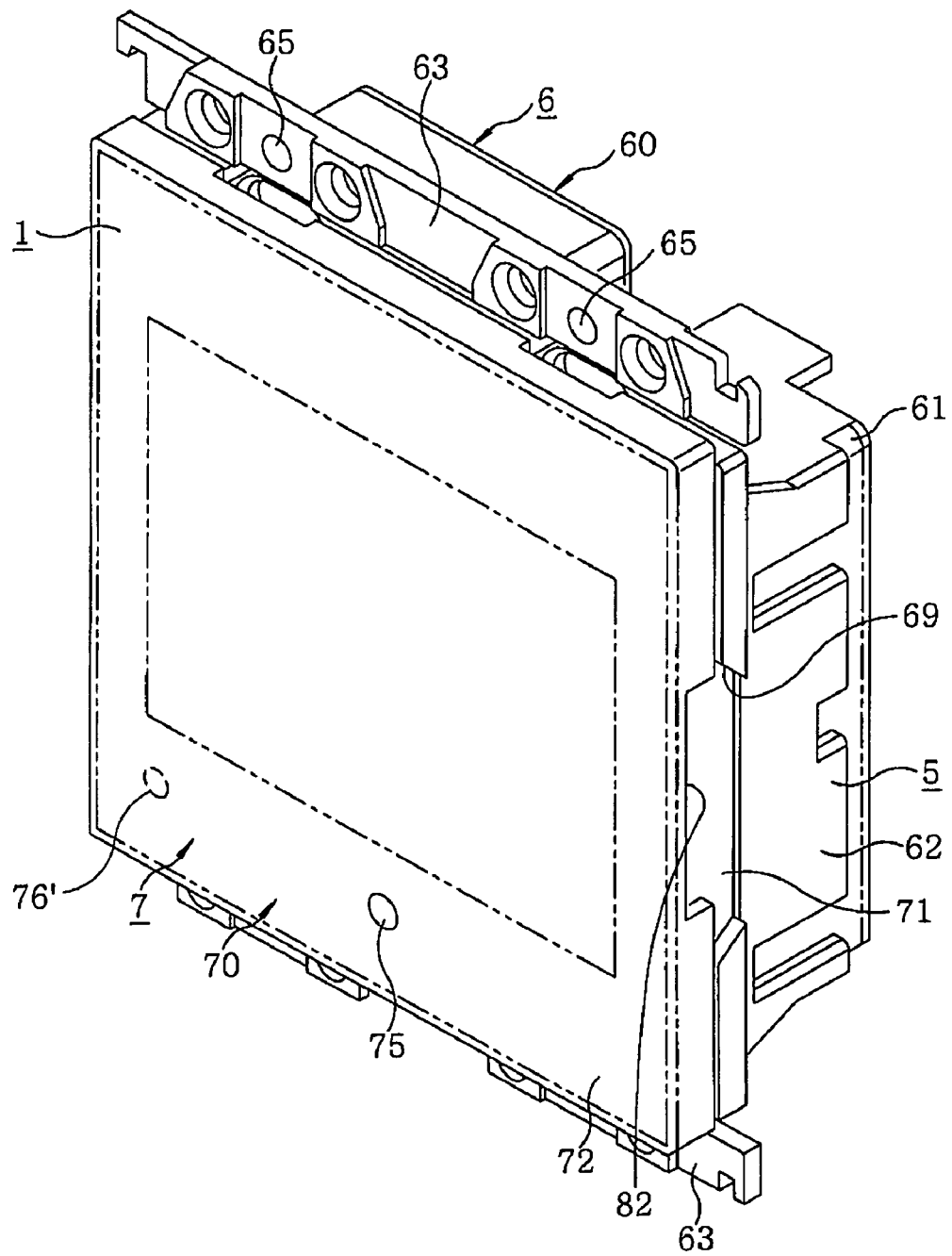
FIG. 4 is a perspective view of the monitoring and control device.

Referring now to FIG. 4, the monitoring and control device 1 includes a generally rectangular box-shaped device housing 5 and is attached to a wall in such a fashion that the rear portion of the device housing 5 is embedded into the wall just like a flush-mounted wiring device. The monitoring and control device 1 is divided into a body unit fixed to the wall so that the rear portion thereof is embedded into the wall and a panel unit 7 detachably attached to the front side of the body unit 6 so that the front portion thereof protrudes forwards from a wall surface (see FIG. 6). Hereinafter, the left, right, top and bottom of the monitoring and control device 1 will be defined under the assumption that it is attached to the wall.

The monitoring and control device 1 includes different circuits divisionally provided in the body unit 6 and the panel unit 7. In the present embodiment, the power supply circuit 10 (see FIG. 3) for supplying electric power to internal circuits and the communication circuit 11 are provided in the body unit 6, while other circuits (for the display panel 2, the operation input unit 3, the main microcomputer 12 and the like) are provided in the panel unit 7.

The body unit 6 includes a body case 60 formed of a box-like embedment body 61 having a rectangular opening on the front surface thereof and a body cover 62 attached to the front surface of the embedment body 61. A circuit board (not shown) that carries different kinds of electric parts is accommodated within the body case 60. The body unit 6 is provided on its rear surface with a power supply terminal portion (not shown) connected to the power supply line and a signal terminal portion (not shown) connected to the signal line Ls.

Figure 5A:
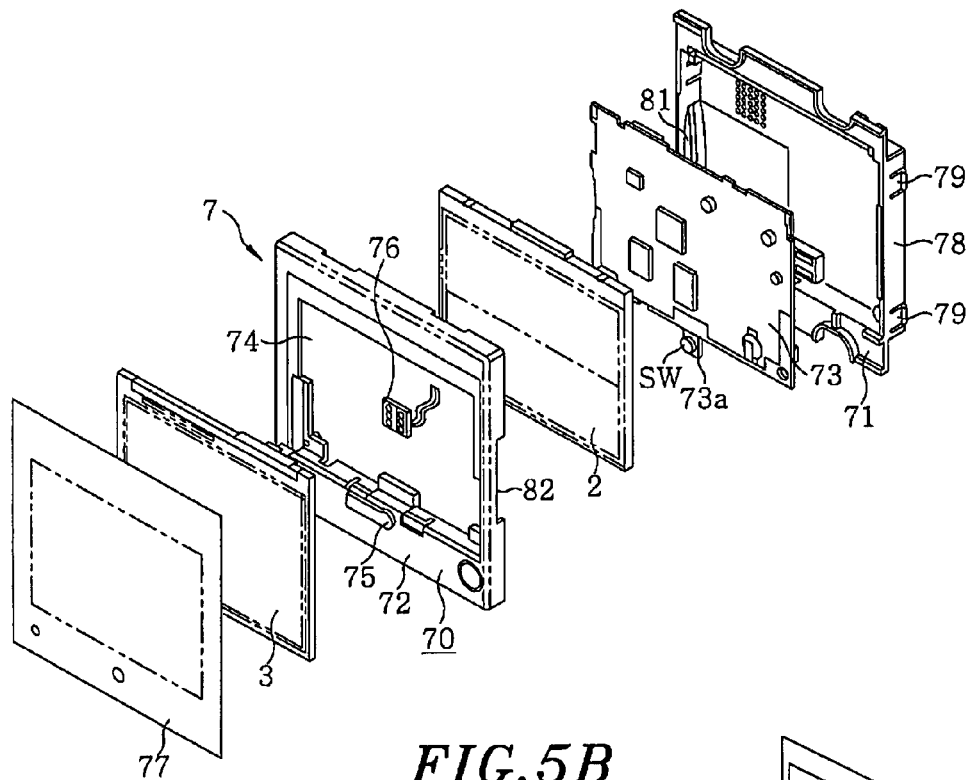
FIG. 5A is an exploded perspective view of the panel unit of the monitoring and control device as seen from the front side thereof.

As can be seen in FIG. 5A, the panel unit 7 includes a panel case 70 formed of a box-like panel body 71 having a rectangular opening on the front surface thereof and a panel cover 72 attached to the front surface of the panel body 71. A circuit board 73 carrying different kinds of electric parts such as the main microcomputer 12 and the like is accommodated within the panel case 70. In the panel unit 7, a rectangular display window 74 is formed in a portion of the front wall of the panel case 70. The display panel 2 and the operation input unit 3 are arranged within the display window 74. Below the display window 74 and at the transverse midpoint in the front wall of the panel case 70, there is provided an operation part 75 for operating a push button switch to be described later. At the left side of the operation part 75, there is provided an LED window (not shown) through which to pass the light irradiated from LEDs. An LED substrate 76 carrying LEDs for status display is arranged within the panel case 70 in a position corresponding to the LED window. A protective membrane sheet 77 is bonded to the front surface of the panel case 70. The position of the LED substrate 76 is not limited to the left lower corner of the panel case 70. The LED substrate 76 may be arranged in any one of four corners of the panel case 70.

The monitoring and control device 1 of the present embodiment is attached to a wall using an wall-mounted embedment box B1 (see FIG. 1) for a flush-mounted wiring device. This is to reduce the protrusion amount of the device housing 5 from a wall surface, to give a sensation of unity in appearance with a flush-mounted wiring device which is in widespread use, and to reduce the cost of members used for installation purposes. A rectangular installation hole H1 (see FIG. 1) is formed in a wall member W1 (see FIG. 1) defining a wall surface W0 (see FIG. 1) in alignment with the embedment box B1. An attachment cavity for attachment of the monitoring and control device 1 is defined by the installation hole H1 and the internal space of the embedment box B1.

The body unit 6 is inserted through the installation hole H1 and attached to the embedment box B1 from the front side thereof. The body case 60 is shaped and sized so that the rear portion thereof can be accommodated within the attachment cavity. In the present embodiment, the body case 60 of the body unit 6 is formed in a size corresponding to the size of the embedment box B1 which can accommodate two installation frames (not shown) for single-row joint use. The term "installation frame for single-row joint use" used herein refers to an installation frame capable of accommodating three wiring devices of a unit size arranged side by side in a width direction (or a vertical direction). The wiring devices are of a flush-mounted type and are standardized by JIS (Japanese Industrial Standards). If two installation frames for single-row joint use are arranged side by side in a transverse direction, it is referred to as "dual-row joint use". The body unit 6 of the present embodiment has such a size that it can be installed in the embedment box B1 for dual-row joint use.

More specifically, the body case 60 includes a pair of attachment pieces 63 integrally formed on the vertical opposite ends thereof to extend away from each other. The attachment pieces 63 are provided in such a fashion as to protrude upwards and downwards from the front end portion of the body case 60 and to extend along the transverse full length of the body case 60. Just like the installation frame used in fixing a flush-mounted wiring device to the embedment box B1, each of the attachment pieces 63 has a plurality of (two, in the present embodiment) box attachment holes 64 through which installation screws are inserted. In the areas of the attachment pieces 63 above and below the box attachment holes 64, there are formed plate-fixing holes 65 for screw-fixing a decoration plate (not shown) attached to the front end portion of the device housing 5 so as to cover the attachment pieces 63.

Figure 6:
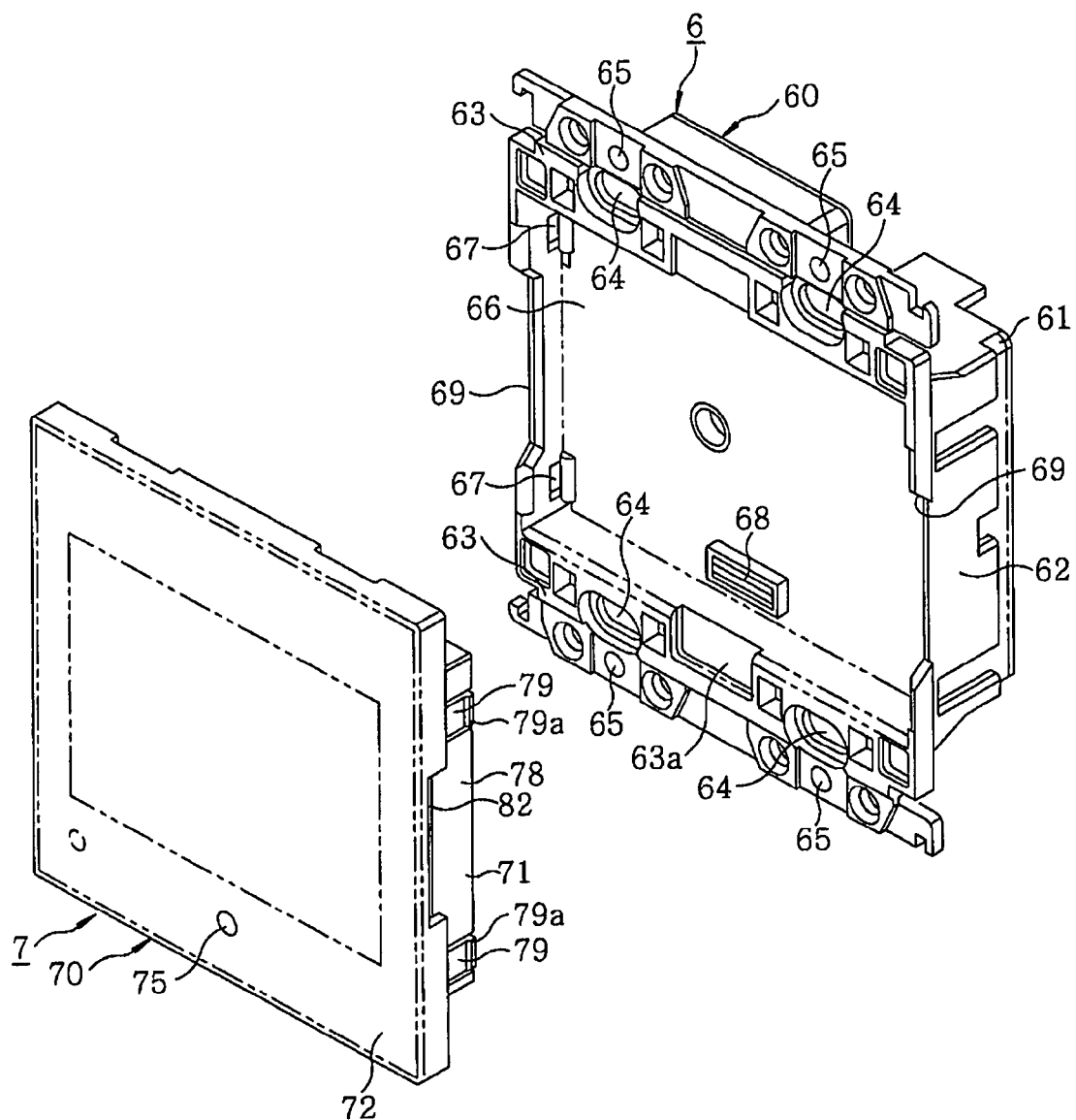
FIG. 6 is a perspective view showing the body unit and the panel unit separated from each other.

The body case 60 and the panel case 70 are provided with fastener units engageable with each other to couple the body unit 6 and the panel unit 7 together. As shown in FIG. 6, the body case 60 has a coupling recess portion 66 formed on the front surface thereof and locking holes 67 formed on the left and right side surfaces of the coupling recess portion 66. The locking holes 67 serve as the fastener unit of the body case 60. The depth of the coupling recess portion 66 is set to ensure that the bottom surface of the coupling recess portion 66 can be positioned rearwards of the wall surface W0. The locking holes 67 are formed in pair on each of the left and right side surfaces of the coupling recess portion 66.

Referring again to FIG. 6, the panel case 70 has a coupling protrusion portion 78 protruding rearwards and getting coupled with the coupling recess portion 66 and locking pieces 79 formed on the left and right side surfaces of the coupling protrusion portion 78. The locking pieces serve as the fastener unit of the panel case 70. The protruding size of the coupling protrusion portion 78 is set to ensure that, when the panel unit 7 is attached to the body unit 6, the tip end surface (or the rear surface) of the coupling protrusion portion 78 can be positioned rearwards of the wall surface W0. The locking pieces 79 are provided in such positions that they can be aligned with the locking holes 67 when the coupling protrusion portion 78 is coupled with the coupling recess portion 66. The locking pieces 79 are provided at their tip ends with locking claws 79a protruding outwards of the panel case 70, thus providing a cantilever type snap-fit structure in which the locking claws 79a are removably fitted to the locking holes 67.

Figure 7:
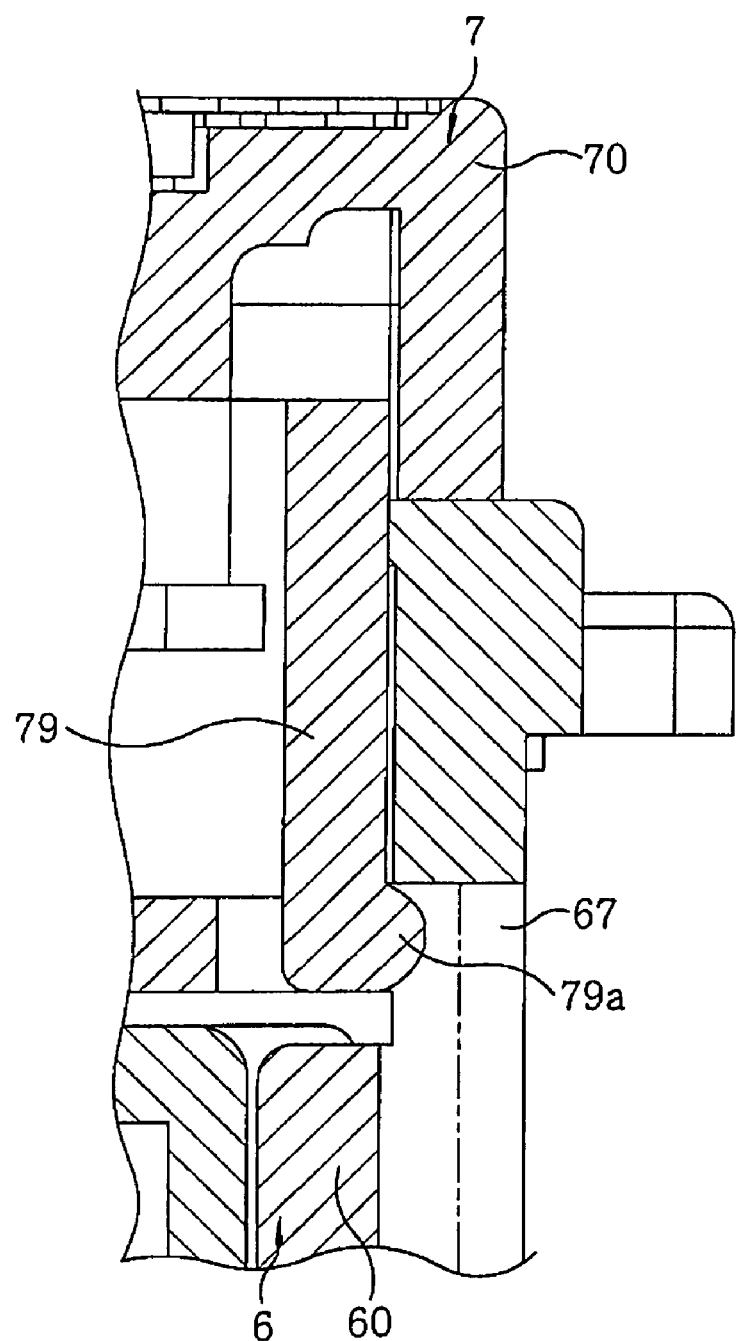
FIG. 7 is a section view showing major parts of the monitoring and control device.

Therefore, if the coupling protrusion portion 78 is coupled with the coupling recess portion 66, the locking claws 79a are inserted into the locking holes 67, as a result of which the locking pieces 79 come into engagement with the locking holes 67 as illustrated in FIG. 7. Thus, the panel unit 7 is mechanically coupled with the body unit 6. Each of the locking claws 79a is formed into a generally triangular shape and has front and rear slanting surfaces that facilitate the operation of attaching the panel unit 7 to the body unit 6 and the operation of removing the panel unit 7 from the body unit 6. Instead of this configuration, it may be possible to employ a configuration in which locking pieces are provided in the body case 60 and locking holes are formed in the panel case 70.

Since the locking claws 79a have a triangular shape as set forth above, they are bent and removed from the locking holes 67 if the panel body 71 is pulled forwards. That is to say, the panel unit 7 can be detached from the body unit 6 by pulling the panel body 71 forwards.

Figure 8:
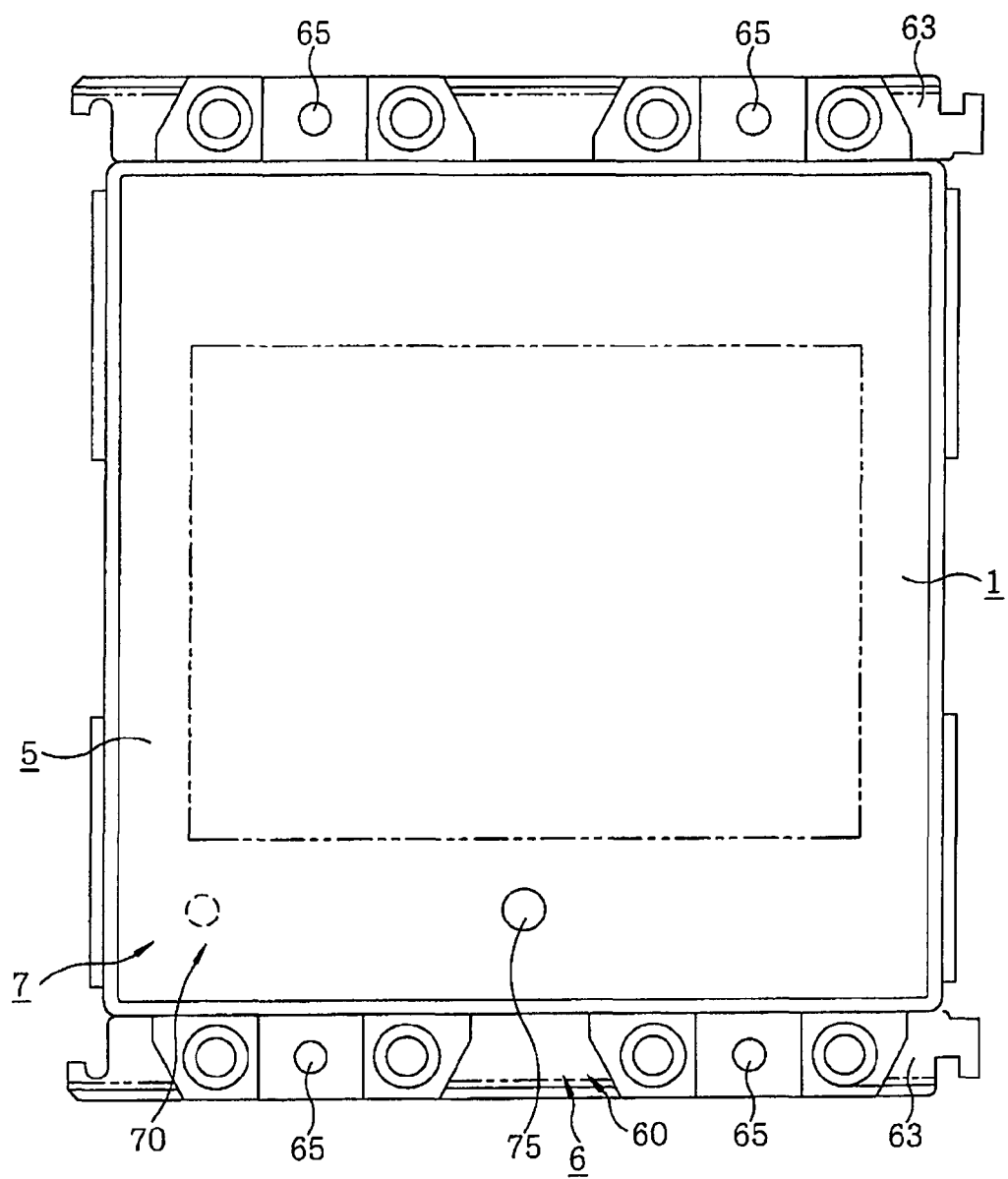
FIG. 8 is a front view of the monitoring and control device.

The transverse dimension of the panel unit 7 is substantially equal to that of the body unit 6 but the vertical dimension of the panel unit 7 is set a little smaller than that of the body unit 6. Therefore, the front surface of the body unit 6 is not fully covered by the panel unit 7 when the panel unit 7 is attached to the body unit 6. The portions of the attachment pieces 63 having the plate-fixing holes 65 are exposed at the upper and lower sides of the panel unit 7 as illustrated in FIG. 8. The exposed portions can be hidden by attaching the decoration plate to the attachment pieces 63. The thickness (or the back-and-forth dimension) of the panel unit 7 is set so that, when the decoration plate is attached, the protruding amount of the decoration plate from the wall surface W0 becomes substantially equal to the protruding amount of the panel unit 7.

The panel unit 7 is provided on its rear surface (i.e., on the tip end surface of the coupling protrusion portion 78) with a panel-side connector 80 (see FIG. 9) for connection with the body unit 6. The body unit 6 is provided on its front surface (i.e., on the bottom surface of the coupling recess portion 66) with a body-side connector 68 (see FIG. 6) which is to be connected to the panel-side connector 80. The body unit 6 and the panel unit 7 are electrically connected to each other by connecting the panel-side connector 80 and the body-side connector 68 together. At least one of the body-side connector 68 and the panel-side connector 80 is formed of a movable stack connector that can be displaced with respect to the device housing 5 within a predetermined range in a plane along the front surface of the device housing 5. This makes it possible to reliably interconnect the body unit 6 and the panel unit 7 even when the body-side connector 68 and the panel-side connector 80 are misaligned due to the variation in the dimensions of the body case 60 and the panel case 70 or the variation in the mounting positions of the electric parts (e.g., the connectors) on the circuit board.

Figure 5B:
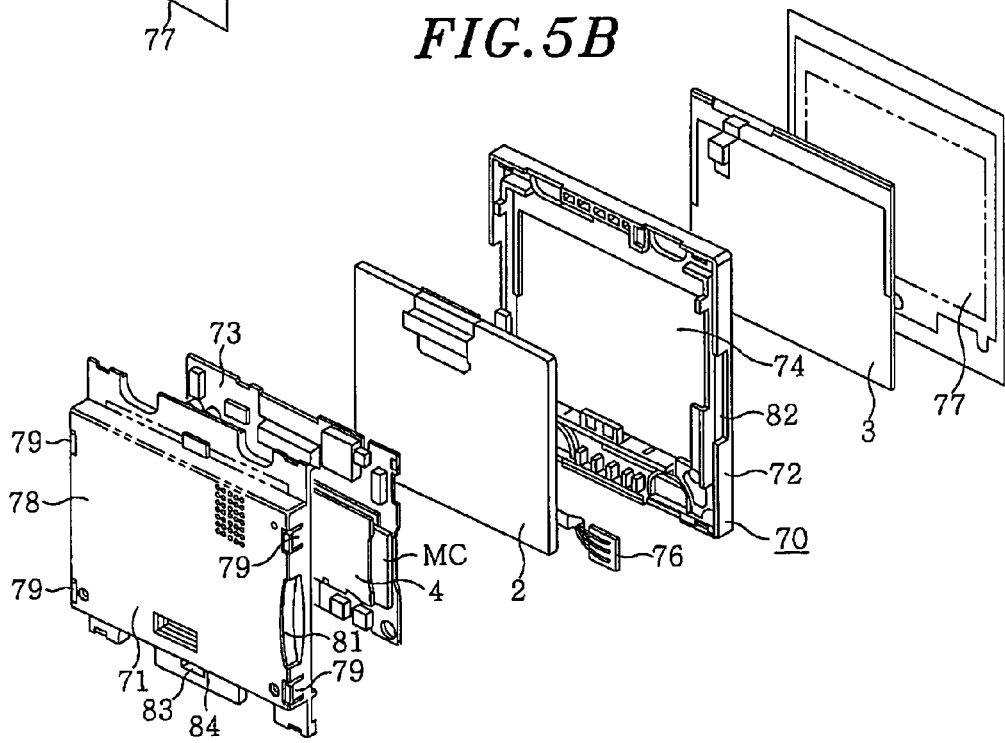
FIG. 5B is an exploded perspective view of the panel unit as seen from the rear side thereof.

Referring to FIG. 5B, the socket 4 of the memory card MC is mounted to the circuit board 73 accommodated within the panel case 70. The socket 4 is mounted to the rear surface of the circuit board 73 in such a position that it can overlap with the display panel 2 in the back-and-forth direction. Therefore, as compared to a configuration in which the display panel 2 and the socket 4 are arranged side by side in the plane coplanar with the front surface of the device housing 5, it is possible to greatly expand the screen of the display panel 2 and to make the screen easily viewable without changing the size of the device housing 5 (i.e., the size of the device housing 5 that can be installed in an embedment box for dual-row joint use).

Figure 1:
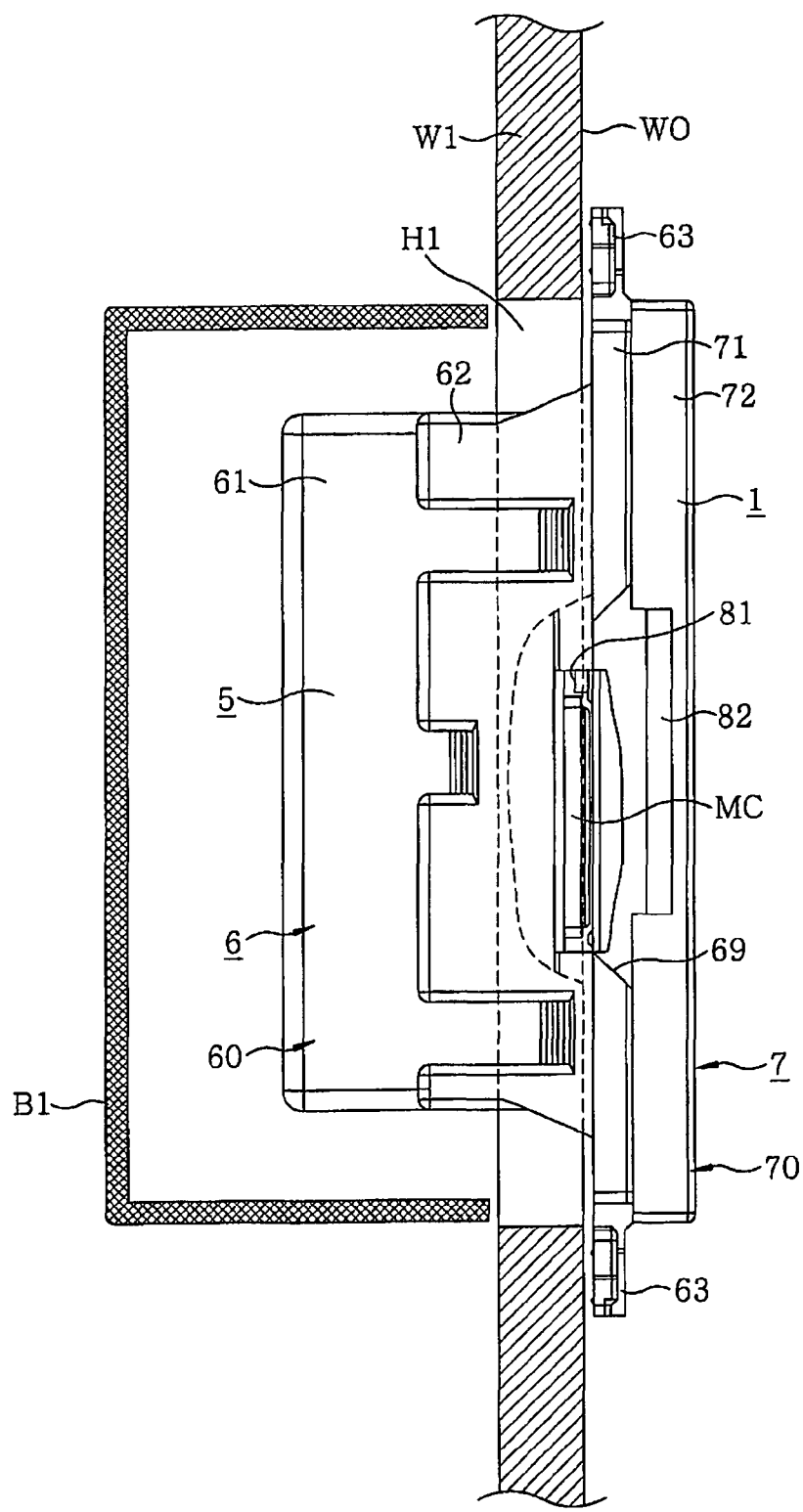
FIG. 1 is a partially cutaway side view showing a monitoring and control device in accordance with a first embodiment of the present invention, which is kept in an installed state.

An insertion slot 81 is formed on one side surface of the panel case 70. The socket 4 has an opening arranged in alignment with the insertion slot 81 so that the memory card MC can be inserted into the opening through the insertion slot 81. The insertion slot 81 is formed on the left surface (or the right surface, when seen from the rear side) of the coupling protrusion portion 78 of the panel case 70 and is arranged in such a position that it can be accommodated within the attachment cavity (i.e., the installation hole H1 of the wall member W1 and the internal space of the embedment box B1) when the body unit 6 and the panel unit 7 are attached to the wall as shown in FIG. 1. Therefore, the tasks of inserting and removing the memory card MC can be performed at the rear side of the panel unit (or the side of the coupling protrusion portion 78) in a state that the panel unit 7 is detached from the body unit 6. The insertion slot 81 may be formed on any peripheral surface (i.e., the right, upper or lower surface as well as the left surface) perpendicular to the front surface of the device housing 5. However, if the insertion slot 81 is arranged on the left surface as in the present embodiment, it becomes possible to arrange the socket 4 with no likelihood of interference with the flexible cable (extending above the circuit board 73) for connecting the display panel 2 and the operation input unit 3 to the circuit board 73. This also facilitates the tasks of inserting and removing the memory card MC.

With the configuration noted above, the insertion slot 81 is opened at the rear side of the wall surface W0 (or at the inner side of the wall) when the device housing 5 is attached to the wall. This makes it impossible to insert or remove the memory card MC in a normal state that the device housing 5 remains attached to the wall. Accordingly, it is possible to prevent the memory card MC from being removed by mischief and to prevent a user from inadvertently inserting or removing the memory card MC. Since the socket 4 is provided in the panel unit 7, the insertion or removal of the memory card MC can be performed by merely removing the panel unit 7 from the body unit 6 without having to detach the body unit 6 from the wall.

The display panel 2 is arranged at the front side of the socket 4. Therefore, as compared to a case where the insertion slot 81 is opened toward the portion of the device housing 5 protruding forwards from the wall surface W0, it is possible to reduce the protruding amount of the display panel 2 from the wall surface W0 and to reduce the protruding amount of the device housing 5 from the wall surface W0. The insertion slot 81 need not be opened within the attachment cavity in its entirety but may be partially opened within the attachment cavity.

Groove portions 82 are formed substantially in the vertical center portions of the left and right side surfaces of the panel case 70. Therefore, when the panel case 70 is gripped at the left and right sides thereof to remove the panel unit 7 from the body unit 6, it becomes easy for a user to grip the panel case 70 by placing the fingers on the groove portions 82. This facilitates the task of detaching the panel unit 7.

Forwardly opened cutouts 69 are formed on the side walls of the coupling recess portion 66 of the body case 60 in alignment with the groove portions 82 of the panel case 70. Due to the provision of the cutouts 69, the groove portions 82 are exposed through the cutouts 69 even when the panel unit 7 is attached to the body unit 6. This provides an advantage in that the panel case 70 can be easily gripped at the left and right sides thereof with no hindrance of the coupling recess portion 66.

Figure 9:
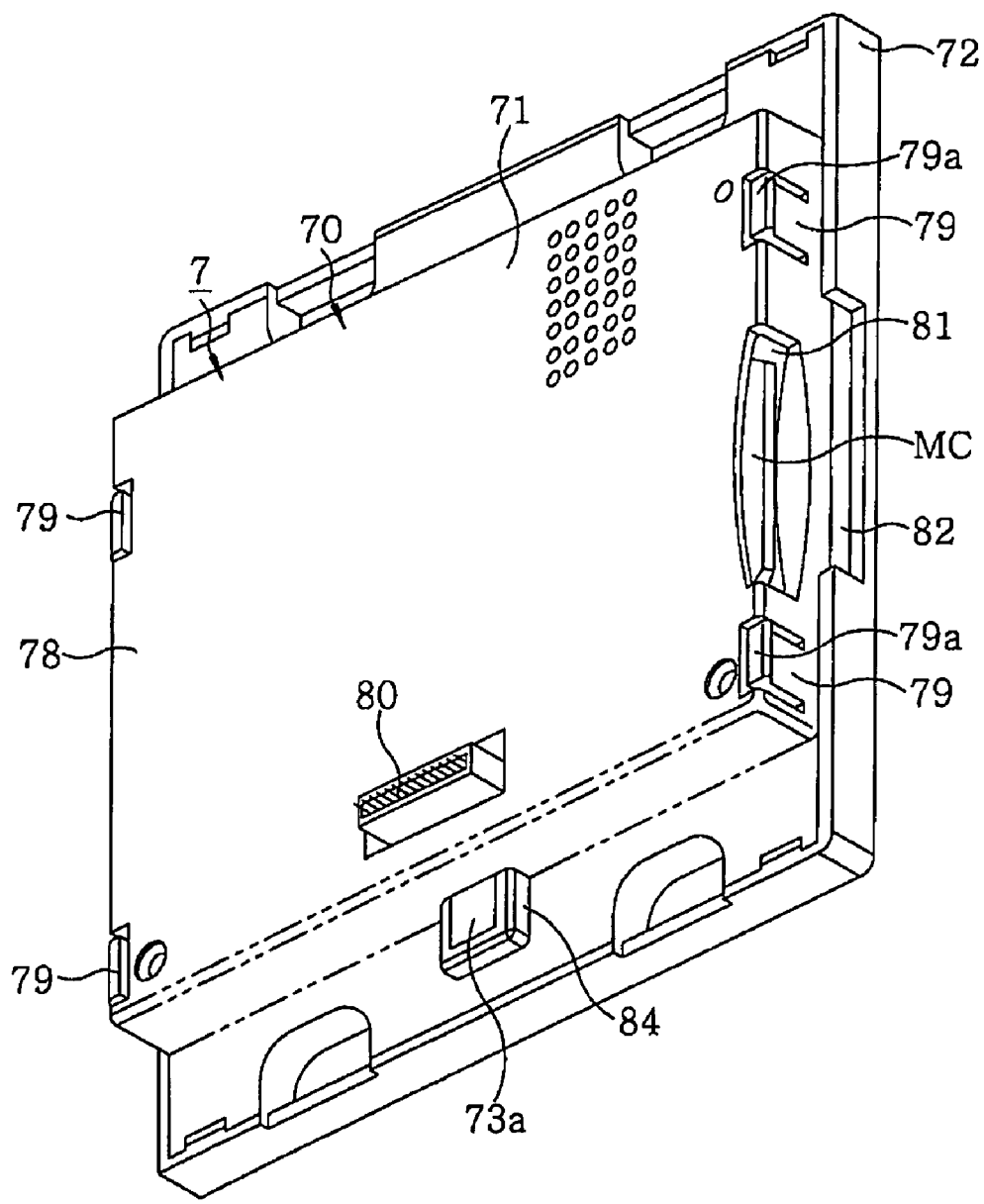
FIG. 9 is a perspective view of the panel unit of the monitoring and control device as seen from the rear side thereof.

In the present embodiment, the display panel 2 and the circuit board 73 to be received within the panel case 70 have the same size as that of the front surface of the rear wall of the coupling protrusion portion 78 so that they can be accommodated within the coupling protrusion portion 78 of the panel case 70 (see FIGS. 5A and 5B). The front surface of the circuit board 73 is substantially fully covered by the display panel 2. In order that the push button switch SW can be operated at the front side of the device housing 5 (by pressing the operation part 75 provided on the front wall of the panel case 70), there is provided a tongue piece 73a extending downwards from the midpoint of the lower side of the circuit board 73. The push button switch SW is mounted on the front surface of the tongue piece 73a. Therefore, as shown in FIG. 9, the tongue piece 73a is arranged in such a fashion that it protrudes downwards from the lower surface of the coupling protrusion portion 78.

Figure 10A:
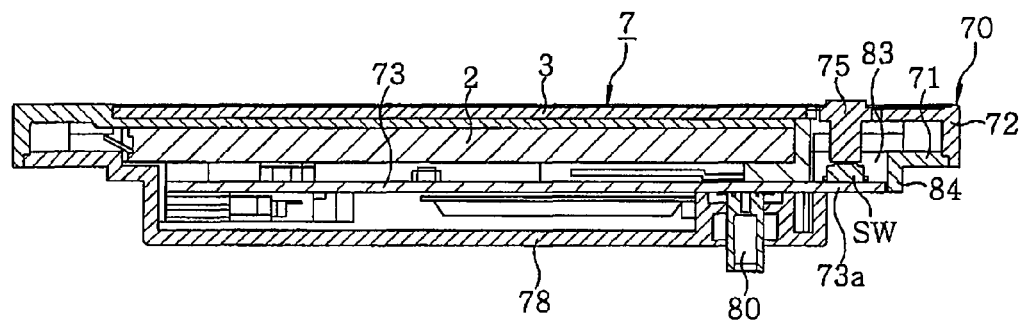
FIG. 10A is a section view showing the panel unit of the monitoring and control device.

Referring now to FIG. 10A, a through-hole 83 extending in the back-and-forth direction is formed on the portion of the rear wall of the panel case 70 corresponding to the push button switch SW. A peripheral wall 84 is provided upright along the peripheral edge of the through-hole 83 in such a fashion as to surround the tongue piece 73a. Thus, the tongue piece 73a is exposed backwards through the through-hole 83. In other words, the tongue piece 73a forms a portion of the outer periphery of the panel unit 7 in cooperation with the panel case 70. By exposing the rear surface of the tongue piece 73a from the panel case 70 in this manner, it is possible to reduce the thickness (or the back-and-forth dimension) of the portion of the panel case corresponding to the push button switch SW by the thickness of the rear wall of the panel case 70.

Figure 10B:
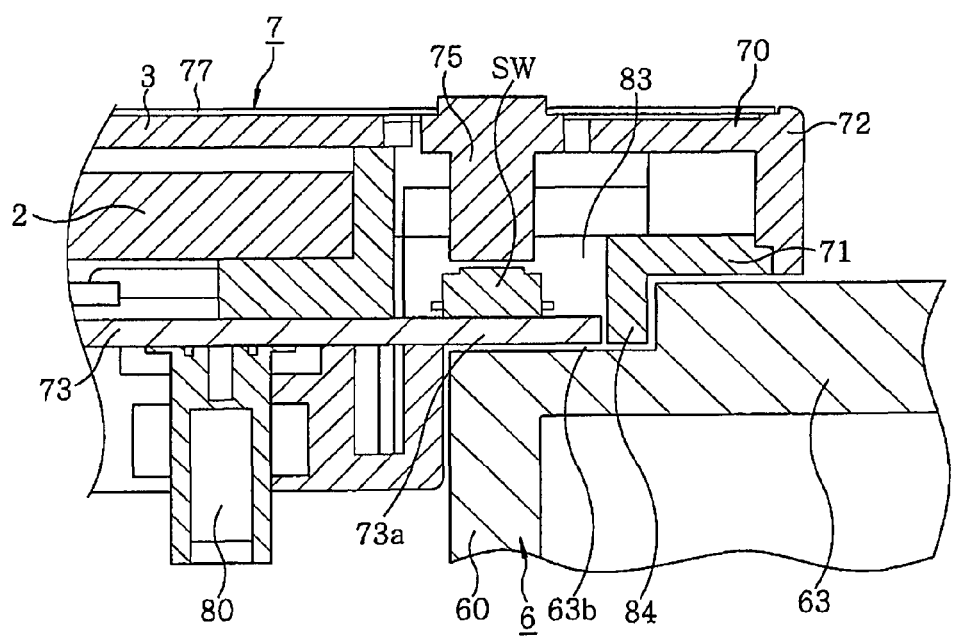
FIG. 10B is a section view showing major parts of the panel unit.

In order to prevent the tongue piece 73a and the peripheral wall 84 from interfering with one of the attachment pieces 63 of the body case 60 when the panel unit 7 is coupled with the body unit 6, a shelter recess portion 63a (see FIG. 6) is formed in the portion of one of the attachment pieces 63 corresponding to the tongue piece 73a and the peripheral wall 84. As shown in FIG. 10B, the bottom surface of the shelter recess portion 63a faces toward the rear surface of the tongue piece 73a when the panel unit 7 is attached in place and serves as a contact surface 63b that makes contact with the rear surface of the tongue piece 73a when the tongue piece 73a is bent backwards. In other words, upon pressing the push button switch SW, the rear surface of the tongue piece 73a comes into contact with the contact surface 63b, which makes it possible for the body unit 6 to receive the external force applied to the push button switch SW. Therefore, it is possible to suppress the bending deformation of the tongue piece 73a and the panel case 70 which would be caused by the operation of the push button switch SW.

The push button switch SW is provided to, e.g., forcibly nullify the operation of the operation input unit 3. That is to say, the operation of the operation input unit 3 is nullified after the pressing operation of the push button switch SW. This makes it possible to avoid erroneous operation of the operation input unit 3 which may occur when the front surface of the panel unit 7 is wiped out. The operation of the operation input unit 3 becomes effective if the push button switch SW is pressed again in the above state.

The present monitoring and control device 1 is not limited to the configuration of the above-described embodiment in which the socket 4 of the memory card MC is arranged in the panel unit 7. Alternatively, the socket 4 may be provided in the body unit 6. In this case, it is needless to say that the insertion slot 81 for the memory card MC is formed in the body case 60. Therefore, there is a need to detach the body unit 6 from the wall for insertion or removal of the memory card MC. As a further alternative, it is possible to employ a configuration in which the body unit 6 and the panel unit 7 are formed into a single unit to make the panel unit 7 inseparable. In this case, the insertion slot 81 for the memory card MC is formed in such a position that it can be placed within the attachment cavity (namely, the installation hole H1 of the wall member W1 and the internal space of the embedment box B1).

Although the memory card MC formed of an SD memory card is used as the external storage medium in the embodiment described above, the present invention is not limited thereto. Alternatively, other memory cards or memory devices such as a USB memory and the like may be used as the external storage medium.

Second Embodiment

A monitoring and control device in accordance with a second embodiment of the present invention will now be described with reference to FIG. 11. The same component parts as those of the first embodiment will be designated by like reference characters and will be omitted from description.

Figure 11:
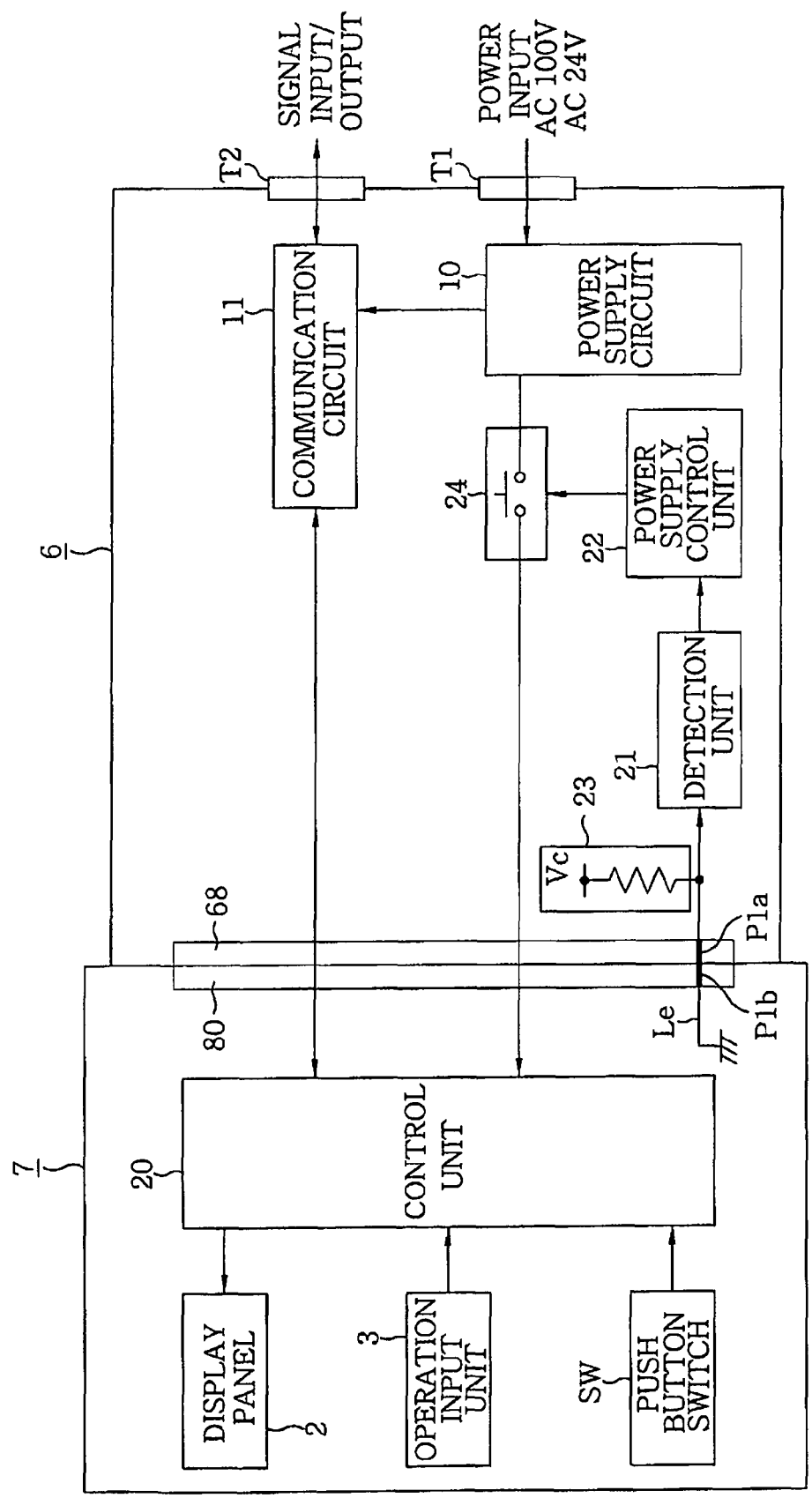
FIG. 11 is a schematic block diagram showing a monitoring and control device in accordance with a second embodiment of the present invention.

As shown in FIG. 11, the body unit 6 includes a power supply terminal portion T1 to which the power supply line is connected and a signal terminal portion T2 to which the signal line Ls is connected. The power supply terminal portion T1 and the signal terminal portion T2 are arranged on the rear surface of the body unit 6.

In the monitoring and control device 1 of the present embodiment, as shown in FIG. 11, the body unit 6 includes a detection unit 21 for detecting the connection between the body-side connector 68 and the panel-side connector 80 and a power supply control unit 22 for on-off controlling the power supply from the power supply circuit 10 to the body-side connector 68. The power supply to the panel unit 7 is started after the detection unit 21 has detected the connection between the connectors 68 and 80. In FIG. 11, the main microcomputer 12 of the panel unit 7 and the peripheral circuits thereof are illustrated as a control unit 20. The component parts having nothing to do with the following description are not illustrated in FIG. 11.

The body unit 6 includes a detection power source 23 for, when the connectors 68 and 80 are connected to each other, supplying an electric current to a detection current line Le connected to the panel-side connector 80 within the panel unit 7. The detection unit 21 detects connection or non-connection of the connectors 68 and 80 by monitoring the electric potential of the connection point between the detection power source 23 and the body-side connector 68.

More specifically, at least one set of contact members of the body-side connector 68 and the panel-side connector 80 mated with each other (or coming into contact with each other) are used as detection pins P1a and P1b. The detection pin P1a of the body unit 6 is connected to the detection power source 23, while the detection pin P1b of the panel unit 7 is connected to the detection current line Le. The detection power source 23 has a positive electric potential point Vc connected to the detection pin P1a through a pull-up resistor. The opposite end of the detection current line Le from the detection pin P1b is connected to the ground. The detection unit 21 is connected to the connection point between the detection power source 23 and the body-side connector 68 (or the detection pin P1a) to monitor the electric potential of the connection point as a detection input.

If the detection input is equal to or greater than a specified value (namely, if the detection input is of a high level), it means the detection pins P1a and P1b are not connected to each other (the electric current is not supplied from the detection power source 23 to the detection current line Le). Therefore, the detection unit 21 determines that the connectors 68 and 80 are not connected to each other. In contrast, if the detection input is smaller than the specified value (namely, if the detection input is of a low level), it means that the detection pins P1a and P1b are connected to each other (the electric current is supplied from the detection power source 23 to the detection current line Le). Therefore, the detection unit 21 determines that the connectors 68 and 80 are connected to each other.

The connection of circuit ground terminals (i.e., the ground connection) in between the body unit 6 and the panel unit 7 is realized by plural sets of contact members (not shown in FIG. 11) in an effort to keep impedance relatively low and to enhance reliability. Therefore, when the panel unit 7 is attached to the body unit 6, the contact members for ground connection are first connected to one another and then the detection pins P1a and P1b are connected to each other in usual cases. As a result, the detection power source 23 feeds an electric current to the detection current line Le.

The power supply control unit 22 serves to on-off control a power supply switch 24 interposed between the power supply circuit 10 and the body-side connector 68. If the detection unit 21 determines that the connectors 68 and are connected to each other, the power supply control unit 22 will turn on the power supply switch 24 in response to the control input supplied from the detection unit 21. As the power supply switch 24 is turned on, an electric current begins to be fed from the power supply circuit 10 to the body-side connector 68. Therefore, the electric power is supplied from the power supply circuit 10 to the panel unit 7 through the body-side connector 68 and the panel-side connector 80. The detection unit 21 and the power supply control unit 22 are realized by, e.g., a microcomputer or the like. The power supply switch 24 may be either a switch with contact points or a switch with no contact point.

The power supply control unit 22 keeps the power supply switch 24 turned on only when it is supplied with a control input from the detection unit 21 (namely, when the detection unit 21 determines that the connectors 68 and 80 are connected to each other). If the connection between the body-side connector 68 and the panel-side connector 80 is released by the removal of the panel unit 7 to thereby disconnect the detection current line Le from the detection power source 23, the power supply control unit 22 turns off the power supply switch 24, thus stopping the power supply from the power supply circuit 10 to the body-side connector 68.

With the configuration described above, when the panel unit 7 is attached to the body unit 6, the body-side connector 68 remains disconnected from the power supply circuit 10 until the detection unit 21 detects connection between the body-side connector 68 and the panel-side connector 80. This makes it possible to connect the panel-side connector 80 to the body-side connector 68 supplied with no electric current. Thanks to this feature, it is possible to avoid occurrence of trouble which would otherwise occur when the connectors 68 and 80 are connected to each other.

In case of performing live-line connection by which the panel-side connector 80 is connected to the body-side connector 68 supplied with an electric current, the contact members of the connectors 68 and 80 may come into contact with one another in a state that the relative positions between the connectors 68 and 80 are out of alignment. This may leave a possibility that the contact member of the panel-side connector 80 makes contact with the contact member of the body-side connector 68 which is not mated with the contact member of the panel-side connector 80. As a result, an abnormal current may flow to cause failure or other trouble in the body unit 6 or the panel unit 7. In addition, variations may occur in the timing at which the contact members of the panel-side connector 80 make contact with the contact members of the body-side connector 68. Thus, the timing of starting the power supply may differ from circuit to circuit (for example, the power supply to the display panel 2 may be started after the power supply to the main microcomputer 12 has begun). This may possibly cause operation trouble in the panel unit 7.

The present monitoring and control device 1 has an advantage in that the reliability can be enhanced by avoiding occurrence of trouble which would occur during the live-line connection set forth above. In case of employing the structure in which the body unit 6 is embedded in the wall as in the present embodiment, the body unit 6 is usually attached to the wall in a state that the power supply line 34 and the signal line Ls are preliminarily connected to the body unit 6. Thereafter, the panel unit 7 is attached to the body unit 6. Therefore, the afore-mentioned configuration capable of avoiding occurrence of trouble otherwise caused by the live-line connection is very useful in the present invention.

The power supply from the power supply circuit 10 to the body-side connector 68 is stopped when the panel unit 7 is removed from the body unit 6. This eliminates the possibility that the body-side connector 68 is exposed to the outside in a power supplying state. Thanks to these feature, it is possible to prevent occurrence of failure or other trouble in the body unit 6, which would occur when an electric current flows through foreign materials adhering to the body-side connector 68 kept in a power supplying state.

It would be possible that the attachment of the panel unit 7 to the body unit 6 is detected by a mechanical switch. In this case, however, there is a need to provide an operation member for the mechanical switch on the surface of the body unit 6 opposed to the panel unit 7. In contrast, the electric connection between the connectors 68 and 80 is detected in the configuration of the present embodiment. Omission of movable parts such as the operation member for the mechanical switch and the like makes it possible to simplify the structure of the monitoring and control device 1. The surface of the body unit 6 opposed to the panel unit can be effectively used in many different ways. For example, function extension terminals can be provided on the surface of the body unit 6 opposed to the panel unit 7. Therefore, as compared to a case where a mechanical switch is provided on that surface, it is possible to increase the space that can be used effectively.

The body-side connector 68 and the panel-side connector 80 are of a transversely-extending type in which the contact members are arranged side by side in the transverse direction. In case where the connection between the connectors 68 and 80 is detected by determining the connection between the detection pins P1$a$ and P1$b$ as in the present embodiment, it is therefore preferable that the detection pins P1$a$ and P1$b$ are respectively arranged at the transverse midpoints of the body-side connector 68 and the panel-side connector 80. Even if the panel unit 7 is obliquely attached to the body unit 6 and comes into a state (one-side contact state) in which the panel-side connector 80 makes contact with the body-side connector 68 only at one transverse end portion thereof, the connection between the connectors 68 and 80 is not detected until the medial portions of the connectors 68 and 80 come into contact with each other. This helps increase the reliability with which the connection is detected by the detection unit 21.

The power supply control unit 22 is not limited to the configuration in which the power supply from the power supply circuit 10 to the body-side connector 68 is started at the time when the connection between the connectors 68 and 80 is detected by the detection unit 21, but may have a configuration in which the power supply to the body-side connector 68 is started after a predetermined time lag from the detecting time. This makes it possible to start the power supply to the panel unit 7 with no generation of chattering, even if the connectors 68 and 80 are repeatedly connected and disconnected when the panel unit 7 is attached to the body unit 6.

The power supply circuit 10 of the body unit 6 often supplies different kinds of electric power differing in voltage to the panel unit 7, e.g., the main microcomputer 12 and its peripheral circuits (such as an interface circuit or the like). In this case, it is preferable that the power supply switches 24 are provided on the respective power supply lines so that the power supply control unit 22 can independently control the power supply switch 24. This makes it possible to apply time lags to the timing of starting the power supply. For example, it is possible to start the power supply to the peripheral circuits after performing the power supply to the main microcomputer 12.

The detection unit 21 is not limited to the configuration of the embodiment described above but may be any configuration insofar as it can detect the connection between the connectors 68 and 80 when the electric potential of the connection point between the detection power source and the body-side connector 68 (namely, the detection input) is changed by the power supply from the detection power source 23 to the detection current line Le. For example, it would be possible to employ a configuration in which two contact members of the body-side connector 68 are used as detection pins, the contact members of the panel-side connector 80 mated with the detection pins being short-circuited by the detection current line, one of the detection pins of the body-side connector 68 being connected to the positive electric potential point Vc, the electric potential of the other detection pin being used as a detection input. With this configuration, the detection input is changed from a low level to a high level if the connectors 68 and 80 are connected to each other so that an electric current is supplied from the detection power source 23 to the detection current line Le.

Third Embodiment

The monitoring and control device 1 of the present embodiment differs from that of the second embodiment in that detection pins are provided at a plurality of points of the body-side connector 68 and the panel-side connector 80.

Figure 12:
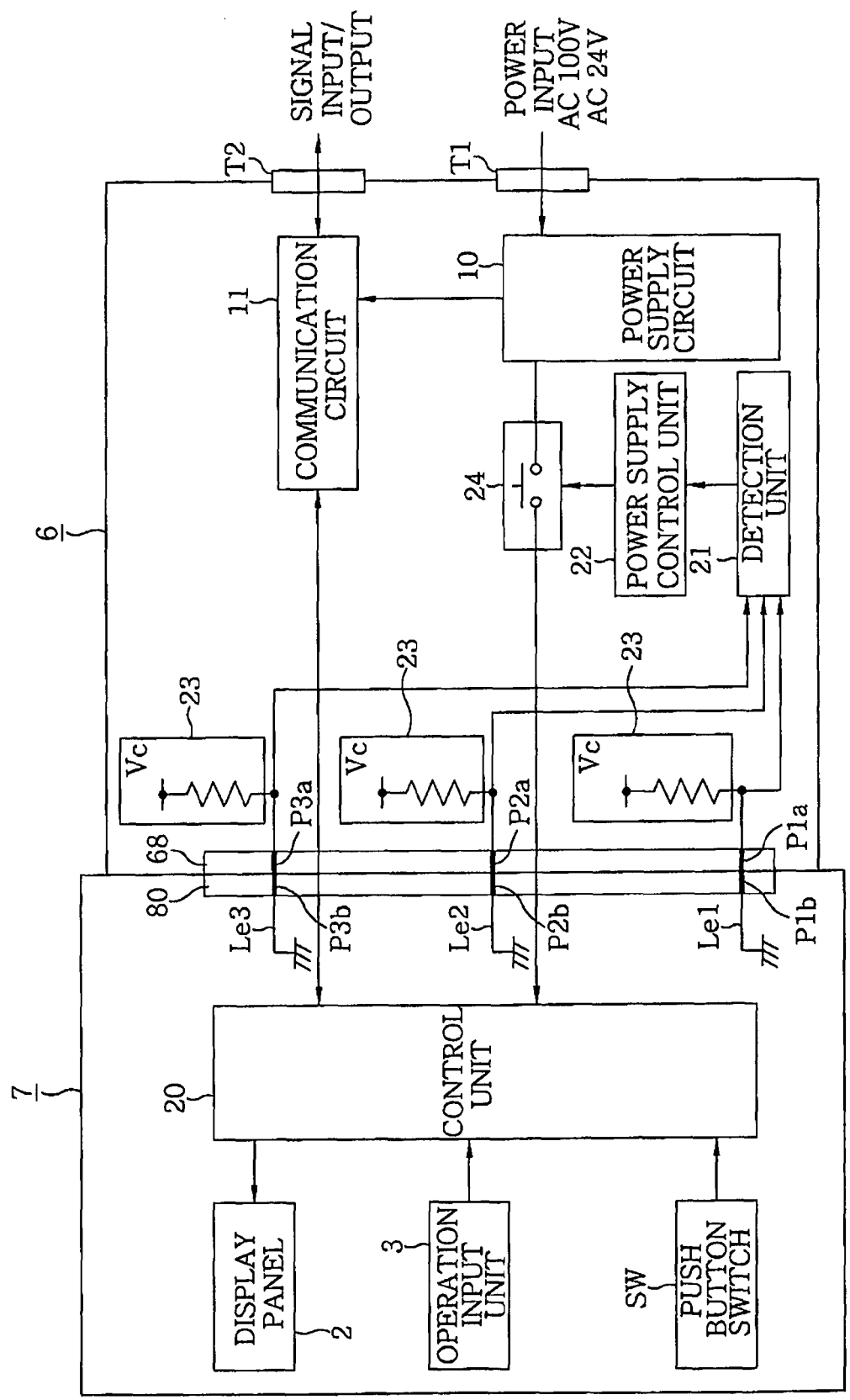
FIG. 12 is a schematic block diagram showing a monitoring and control device in accordance with a third embodiment of the present invention.

In the present embodiment, as shown in FIG. 12, a detection pin P1a is provided in the left end portion (i.e., the lower end portion in FIG. 12) of the body-side connector 68, a detection pin P2a being provided in the medial portion, a detection pin P3a being provided in the right end portion. Detection pins P1b, P2b and P3b are provided in the portions of the panel-side connector 80 corresponding to the detection pins P1a, P2a and P3a. The detection pins P1b, P2b and P3b of the panel-side connector 80 are connected to the corresponding detection current lines Le1, Le2 and Le3. Detection power sources 23 are provided in a corresponding relationship with the respective detection current lines Le1, Le2 and Le3 (namely, the detection pins P1a, P2a and P3a).

The detection unit 21 receives detection inputs from the connection points between the detection power sources 23 and the body-side connector 68 (namely, the detection pins P1a, P2a and P3a) If the detection inputs are all in the high level, the detection unit 21 determines that the connectors 68 and 80 have been connected to each other. In other words, the detection unit 21 takes the logical product of the detection inputs acquired for the respective detection current lines Le1, Le2 and Le3. If at least one of the detection current lines Le1, Le2 and Le3 is not supplied with an electric current, the detection unit 21 determines that the connectors 68 and 80 are not connected to each other. Therefore, the power supply control unit 22 does not start the power supply from the power supply circuit 10 to the panel unit 7 until and unless the detection power source 23 feeds an electric current to all of the detection current lines Le1, Le2 and Le3.

Even when the panel unit 7 is obliquely attached to the body unit 6, the connection between the connectors 68 and 80 will not be detected until the left end, central and right end portions of the panel-side connector 80 are all brought into contact with the body-side connector 68. This helps enhance the connection detecting reliability of the detection unit 21. Accordingly, it is possible to prevent the power supply to the panel unit 7 from being started in a state that the connectors 68 and 80 are incompletely connected to each other, e.g., in a state (one-side contact state) that the panel-side connector 80 makes contact with the body-side connector 68 only at one transverse end portion thereof.

Although each of the connectors 68 and 80 is provided with three detection pins in the present embodiment, the present invention is not limited thereto. As long as the detection pins are provided at different points of the connectors 68 and 80, it is possible to prevent the power supply to the panel unit 7 from being started in a state that the connectors 68 and 80 are incompletely connected to each other.

Other configurations and functions of the monitoring and control device 1 of the present embodiment remains the same as those of the second embodiment.

Fourth Embodiment

The monitoring and control device 1 of the present embodiment differs from that of the third embodiment in that the detection current lines connected to different points of the panel-side connector 80 are all connected in series so as to form a single detection current line Le.

Figure 13:
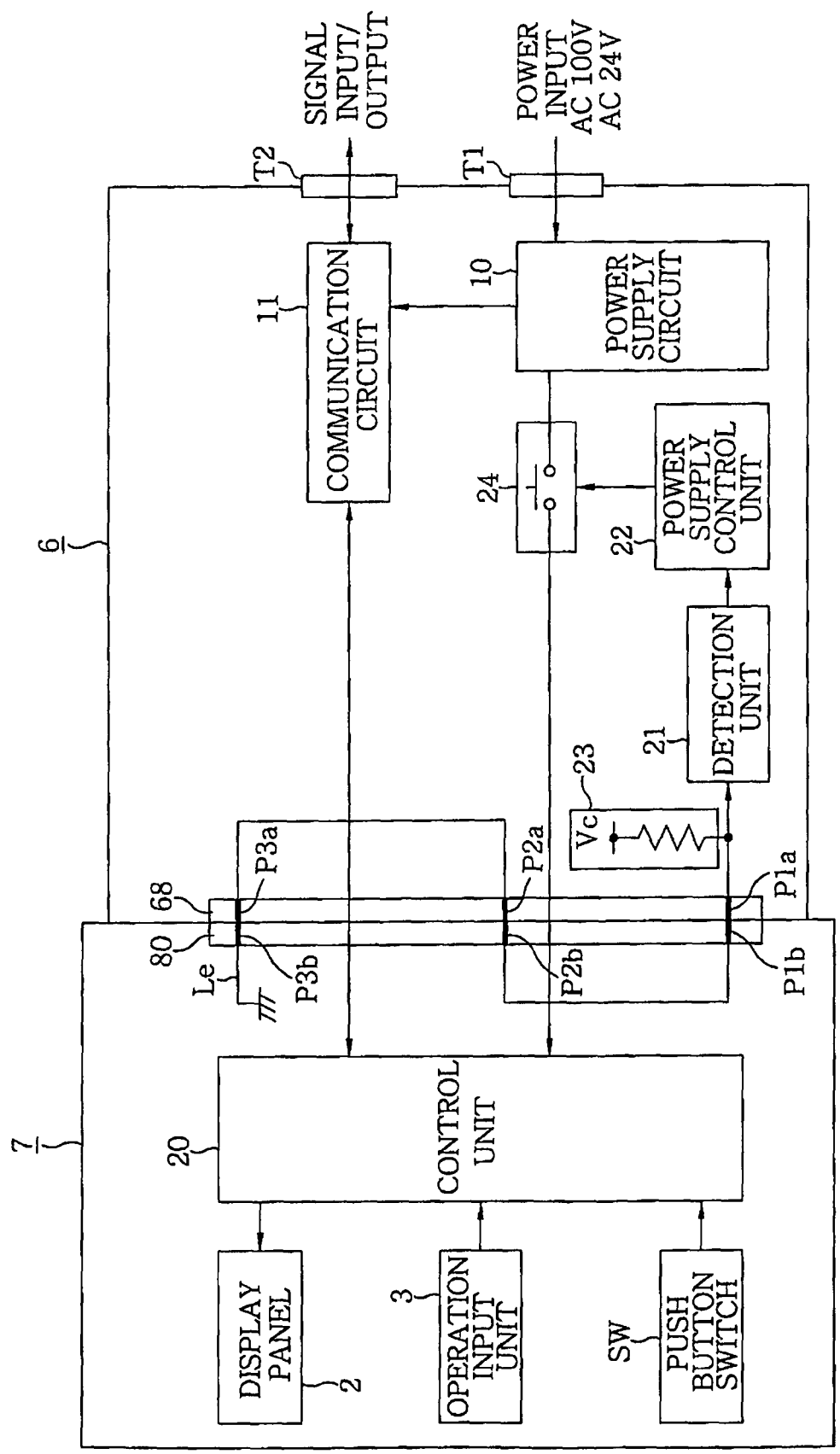
FIG. 13 is a schematic block diagram showing a monitoring and control device in accordance with a fourth embodiment of the present invention.

In the present embodiment, as shown in FIG. 13, the detection pins P1b and P2b of the panel unit 7 are connected to each other and the detection pins P2a and P1a of the body unit 6 are connected to each other. Thus, the detection current lines Le1, Le2 and Le3 of the second embodiment are consolidated into a single detection current line Le. The detection power source 23 is connected only to the detection pin P1a of the body-side connector 68.

The detection unit 21 is supplied with a detection input from the connection point between the detection power source 23 and the body-side connector 68 (namely, the detection pin P1a). As described in connection with the second embodiment, if the detection input is in a low level, the detection unit 21 determines that an electric current is being fed from the detection power source 23 to the detection current line Le and that the connectors 68 and 80 have been connected to each other.

With this configuration, the power supply state of the detection current line connected to the different points of the panel-side connector 80 can be monitored using a single detection input. As compared to a case where a plurality of detection inputs is monitored as in the second embodiment, it is possible to reduce the number of input ports that are required to monitor the detection input using, e.g., a microcomputer. In addition, it is possible to alleviate the processing load.

Other configurations and functions of the monitoring and control device 1 of the present embodiment remains the same as those of the third embodiment.

Although the body unit 6 of the monitoring and control device 1 described in connection with the foregoing embodiments is of an embedded type, the present invention is not limited thereto. Alternatively, the body unit 6 of the monitoring and control device 1 may be of an exposed type in which the body unit 6 is fixed to a wall with the rear surface thereof opposed to a wall surface.

Fifth Embodiment

A monitoring and control device in accordance with a fifth embodiment of the present invention will now be described with reference to FIG. 14. The same component parts as those of the first embodiment will be designated by like reference characters and will be omitted from description.

Figure 14:
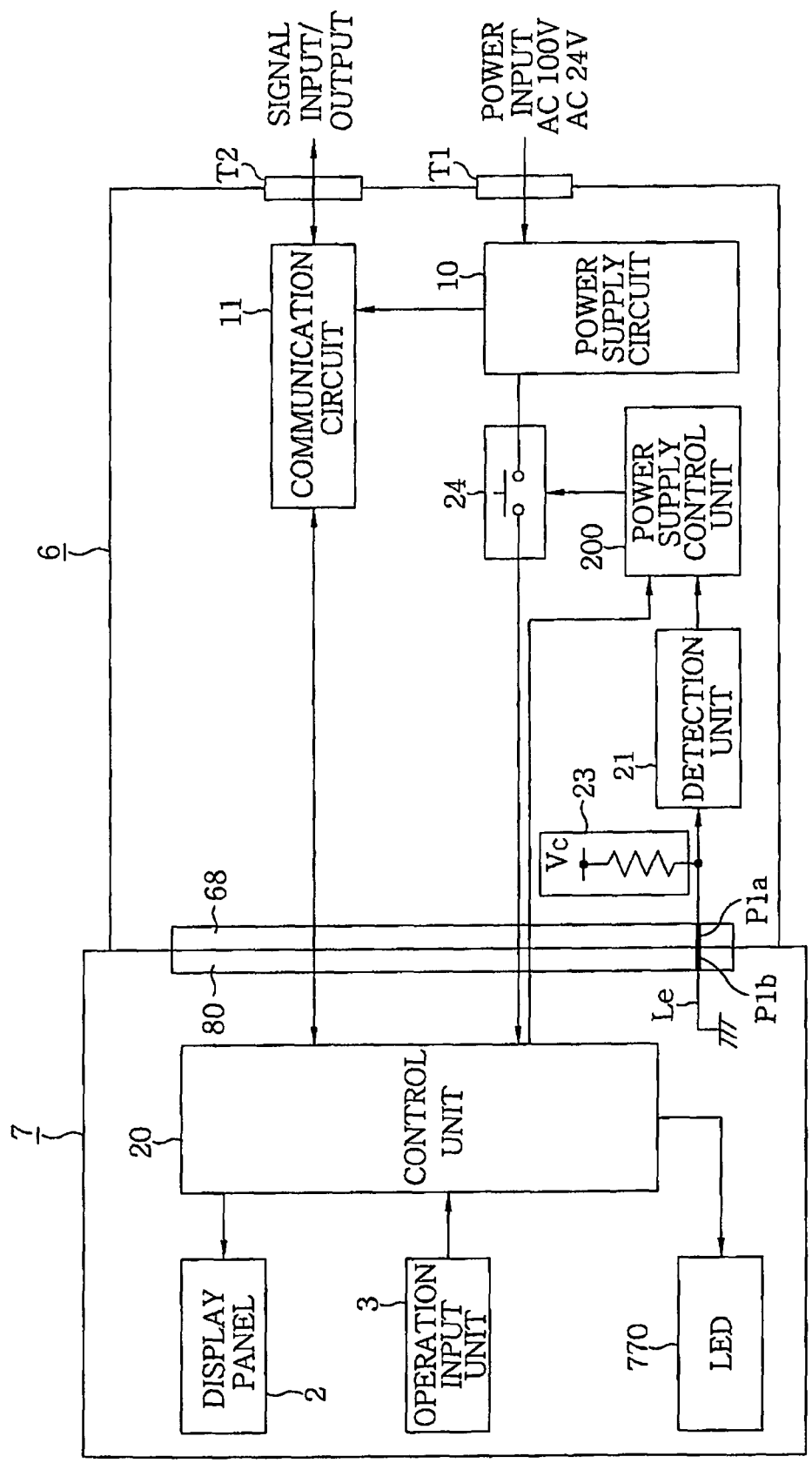
FIG. 14 is a schematic block diagram showing a monitoring and control device in accordance with a fifth embodiment of the present invention.

In the monitoring and control device 1 of the present embodiment, the body unit 6 includes a power supply control unit 200 for controlling the power supply from the power supply circuit 10 to the body-side connector 68 as the ending operation portion of the panel unit 7 is operated in a state that the panel unit 7 is attached to the body unit 6 as shown in FIG. 14. The operation input unit 3 is used as the ending operation portion. If a specified operation input is applied to the operation input unit 3, the power supply control unit 200 turns off the power supply to the body-side connector 68 and consequently stops the power feeding to the panel unit 7. In FIG. 14, the main microcomputer 12 of the panel unit 7 and the peripheral circuits thereof are illustrated as a control unit 20. The component parts having nothing to do with the following description are not illustrated in FIG. 14.

The power supply control unit 200 is designed to on-off control the power supply switch 24 interposed between the power supply circuit 10 and the body-side connector 68. The power supply control unit 200 turns the power supply switch 24 off in response to the ending signal generated from the operation input unit 3 when a specified operation input is applied to the operation input unit 3. As the power supply switch 24 is turned off, the body-side connector 68 is disconnected from the power supply circuit 10, thereby stopping the power supply from the power supply circuit 10 to the body-side connector 68 and eventually cutting off the electric power supplied from the power supply circuit 10 to the panel unit 7 through the body-side connector 68 and the panel-side connector 80. The power supply control unit 200 is realized by, e.g., a microcomputer or the like. The power supply switch 24 may be either a switch with contact points or a switch with no contact point.

In the present embodiment, the ending signal outputted from the operation input unit 3 is transmitted to the power supply control unit 200 of the body unit 6 through the control unit 20. Upon receiving the ending signal from the operation input unit 3, the control unit 20 performs an ending process by which to safely stop the operation of the panel unit 7. The power supply control unit 200 does not turns off the power supply switch 24 immediately upon receiving the ending signal but turns off the power supply switch 24 with a time lag after the reception of the ending signal so that the control unit 20 can perform the ending process during the time lag. Since the power supply to the panel unit 7 can be stopped after safely stopping the operation of the panel unit 7 through the ending process, it is possible to avoid occurrence of such a situation that data are destroyed by stopping the power supply during the course of storing the data in the flash memory 13. Alternatively, the control unit 20 may transmit the ending signal to the power supply control unit 200 at the final step of the ending process so that the power supply control unit 200 can turn off the power supply switch 24 in response to the ending signal.

The operation input unit 3 allows a worker to perform an operation associated with the display of the display panel 2. For example, if the worker selects an ending icon (a graphic or symbol) from the menu screen displayed on the display panel 2, there appears a selection screen for allowing the worker to select execution or non-execution of the ending process. If an ending process execution icon is selected in the selection screen, an ending signal is inputted from the operation input unit 3 to the control unit 20. In response, the control unit 20 executes the ending process and sends the ending signal to the power supply control unit 200. In order to avoid occurrence of such a situation that the ending process is inadvertently executed at a normal time due to the worker's erroneous operation of the operation input unit 3, it is desirable to employ, e.g., a configuration in which the worker is asked to input a pre-stored password when selecting the ending process execution icon. The input operation for causing the operation input unit 3 to generate the ending signal is not limited to the one described above. As an alternative example, the input operation may be performed by continuously touching a plurality of specific icons for several seconds.

With the configuration described above, when there is a need to detach the panel unit 7 from the body unit 6 for maintenance of the monitoring and control device 1 or for other purposes, the power supply to the panel unit 7 can be stopped prior to detachment thereof by preliminarily performing the input operation for generation of the ending signal in the operation input unit 3. Therefore, it is possible to avoid generation of noises such as a surge current and the like, which would be generated if the panel unit 7 is detached in a power supplying state to release the connection between the connectors 68 and 80. As a result, it is possible to avoid occurrence of failure or other trouble in the panel unit 7 or the body unit 6, which would otherwise occur during detachment of the panel unit 7 due to the noises such as a surge current and the like.

Since the power supply from the power supply circuit to the body-side connector 68 is stopped prior to detachment of the panel unit 7, it is possible to prevent the body-side connector 68 from being exposed to the outside in a power supplying state when the panel unit 7 is detached from the body unit 6. Thanks to these feature, it is possible to prevent occurrence of failure or other trouble in the body unit 6, which would otherwise occur when an electric current flows through foreign materials adhering to the body-side connector 68 kept in a power supplying state.

Inasmuch as the insertion and removal of the memory card MC is performed in a state that the panel unit 7 is detached from the body unit 6, there is no possibility that the memory card MC is inserted or removed while an electric current is supplied to the panel unit 7. Thanks to these feature, it is possible to prevent generation of noises such as a surge current and the like, which would otherwise be generated by the voltage applied to the socket 4 during insertion and removal of the memory card MC. This makes it possible to prevent the memory card MC from being destroyed under the influence of the noises.

The following advantageous effects are provided by employing the detection unit 21 shown in FIG. 14. Even if the power supply from the power supply circuit 10 to the body-side connector 68 is stopped to detach the panel unit 7, the power supply to the body-side connector 68 is automatically resumed upon attaching the panel unit 7 to the body unit 6 again. This makes it possible to start the power supply to the panel unit 7. When the panel unit 7 is attached to the body unit 6, the body-side connector 68 remains disconnected from the power supply circuit 10 until the connection between the connectors 68 and 80 is detected by the detection unit 21. This makes it possible to connect the panel-side connector 80 to the body-side connector 68 kept in a current cutoff state. As a result, even if the contact members of the connectors 68 and 80 come into contact with each other in a state that the relative positions of the connectors 68 and 80 are out of alignment, or even if variations occur in the timing at which the contact members of the panel-side connector 80 make contact with the contact members of the body-side connector 68, there is no possibility that an abnormal current flows through the connectors 68 and 80 and that a time lag is generated in the timing of starting the power supply to different circuits.

In the present embodiment, the LED 770 provided in the panel unit 7 for indicating the position of the monitoring and control device 1 is used as an indicator unit for indicating the power supply to the panel unit 7. More specifically, the LED 770 is supplied with electric power from the power supply circuit 10 and is kept turned on while the electric power is fed from the power supply circuit 10 to the panel unit 7. Depending on the on-off state of the LED 77, it is possible for a worker to determine whether an electric current is supplied to the panel unit 7. When the panel unit 7 is detached from the body unit 6, therefore, the worker can see the stoppage of power supply to the panel unit 7 by confirming the off-state of the LED 77. This makes sure that the panel unit 7 is detached from the body unit 6 after stoppage of power supply to the panel unit 7. The ending process under progress may be notified to the worker by changing the on-off pattern of the LED 770 (e.g., by flickering the LED 77) while the ending process is performed by the control unit 20.

Sixth Embodiment

Figure 15:
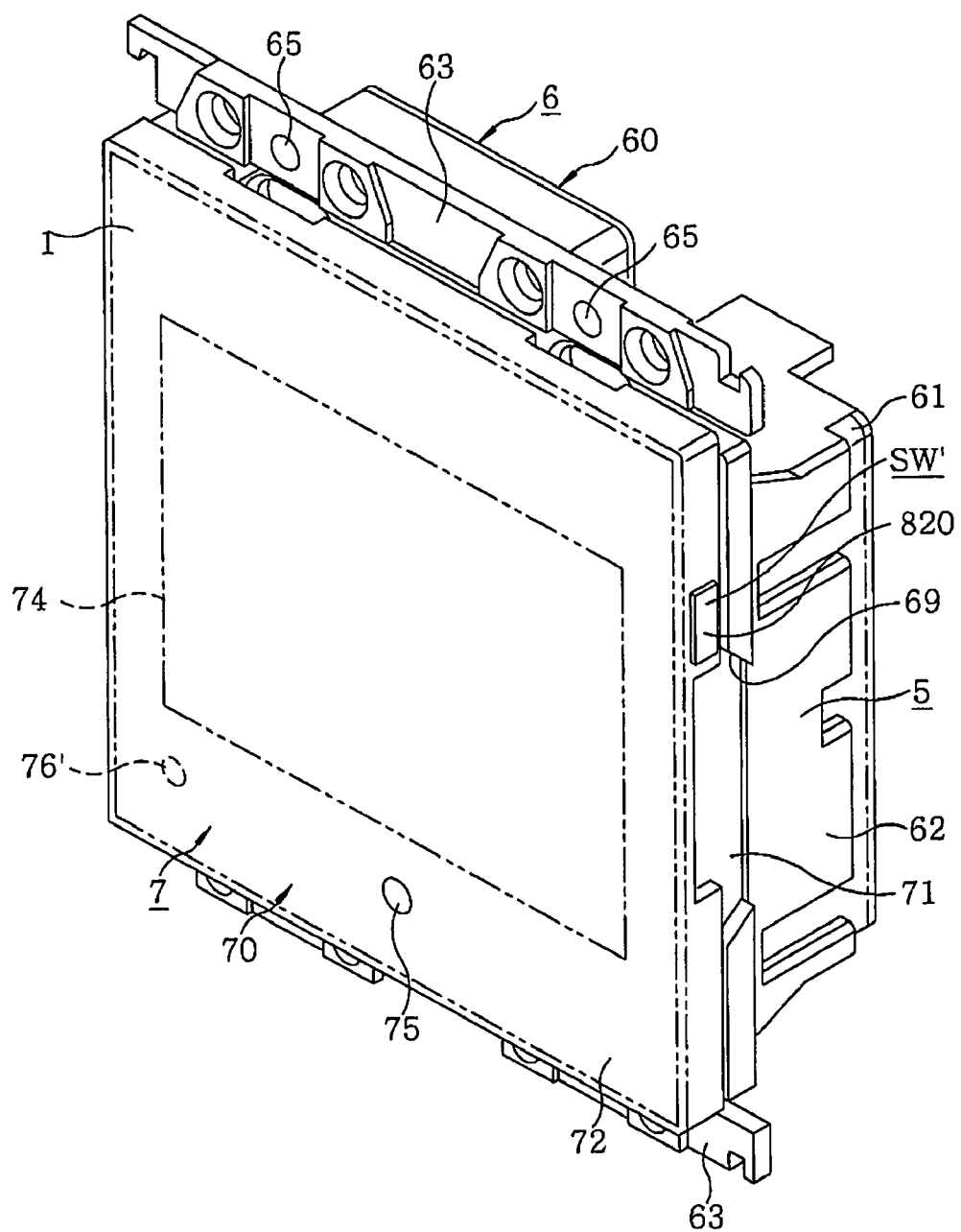
FIG. 15 is a perspective view showing a monitoring and control device in accordance with a sixth embodiment of the present invention.

The monitoring and control device 1 of the present embodiment differs from that of the fifth embodiment in that, as shown in FIG. 15, an ending switch SW' formed of a push button switch and serving as the ending operation portion of the panel unit 7 is provided independently of the operation input unit 3 so that an ending signal can be generated by operating the ending switch SW'.

The ending switch SW' includes an operation member 820 provided on the right surface of the panel case 70 and arranged forwards of the front surface of the body unit 6 when the panel unit 7 is attached to the body unit 6. An ending signal is generated upon pressing the operation member 820. When the panel unit 7 is detached from the body unit 6, the worker grips the portion of the panel case 70 where the operation member 820 is provided. This makes it possible to stop the power supply from the power supply control unit 20 to the panel unit 7 prior to releasing the connection between the connectors 68 and 80 and without having to perform any cumbersome operation of the operation input unit 3.

The position of the operation member 820 is not limited to the right surface of the panel case 70 but may be any peripheral surface of the panel case 70 intersecting the front surface thereof. In the present embodiment, the panel unit 7 and the body unit 6 are coupled together by bringing the locking pieces 79 provided on the left and right surfaces of the coupling protrusion portion 78 into engagement with the locking holes 67 of the body unit 6. When detaching the panel unit 7, the worker usually grips the left and right sides of the panel case 70 in an effort to release the engagement between the locking pieces 79 and the locking holes 67. Therefore, if the operation member 820 is arranged on one of the left and right surfaces of the panel case 70, it can be naturally operated when the worker grips the panel case 70.

As an alternative example of the present embodiment, it may be possible to employ a configuration in which the mechanical coupling between the body unit 6 and the panel unit 7 is released by operating a release button serving as the operation member 820 of the ending switch SW'. More specifically, the locking pieces 79 of the panel unit 7 may be operatively connected to the release button so that, when the release button is operated, the locking claws 79a can be removed from the locking holes 67. The coupling between the body unit 6 and the panel unit 7 is not released until the release button is operated. In this structure, the release button needs to be operated in order to detach the panel unit 7. Thus, the operation member 820 of the ending switch SW' serving as the release button is necessarily operated. In other words, the operation member 820 is surely operated to detach the panel unit 7, whereby the power supply to the panel unit 7 is stopped by the power supply control unit 20. Accordingly, it is possible to prevent the panel unit 7 from being detached without stopping the power supply to the panel unit 7.

The ending switch SW' is not limited to the push button switch but may be, e.g., a slide switch for sliding the operation member 820.

Other configurations and functions of the monitoring and control device 1 of the present embodiment remains the same as those of the fifth embodiment.

Although the body unit 6 of the monitoring and control device 1 described in connection with the foregoing embodiments is of an embedded type, the present invention is not limited thereto. Alternatively, the body unit 6 of the monitoring and control device 1 may be of an exposed type in which the body unit 6 is fixed to a wall with the rear surface thereof opposed to a wall surface.

Seventh Embodiment

A monitoring and control device in accordance with a seventh embodiment of the present invention will now be described with reference to FIGS. 16 through 19 and FIG. 21. The same component parts as those of the first embodiment will be designated by like reference characters and will be omitted from description.

Figure 21:
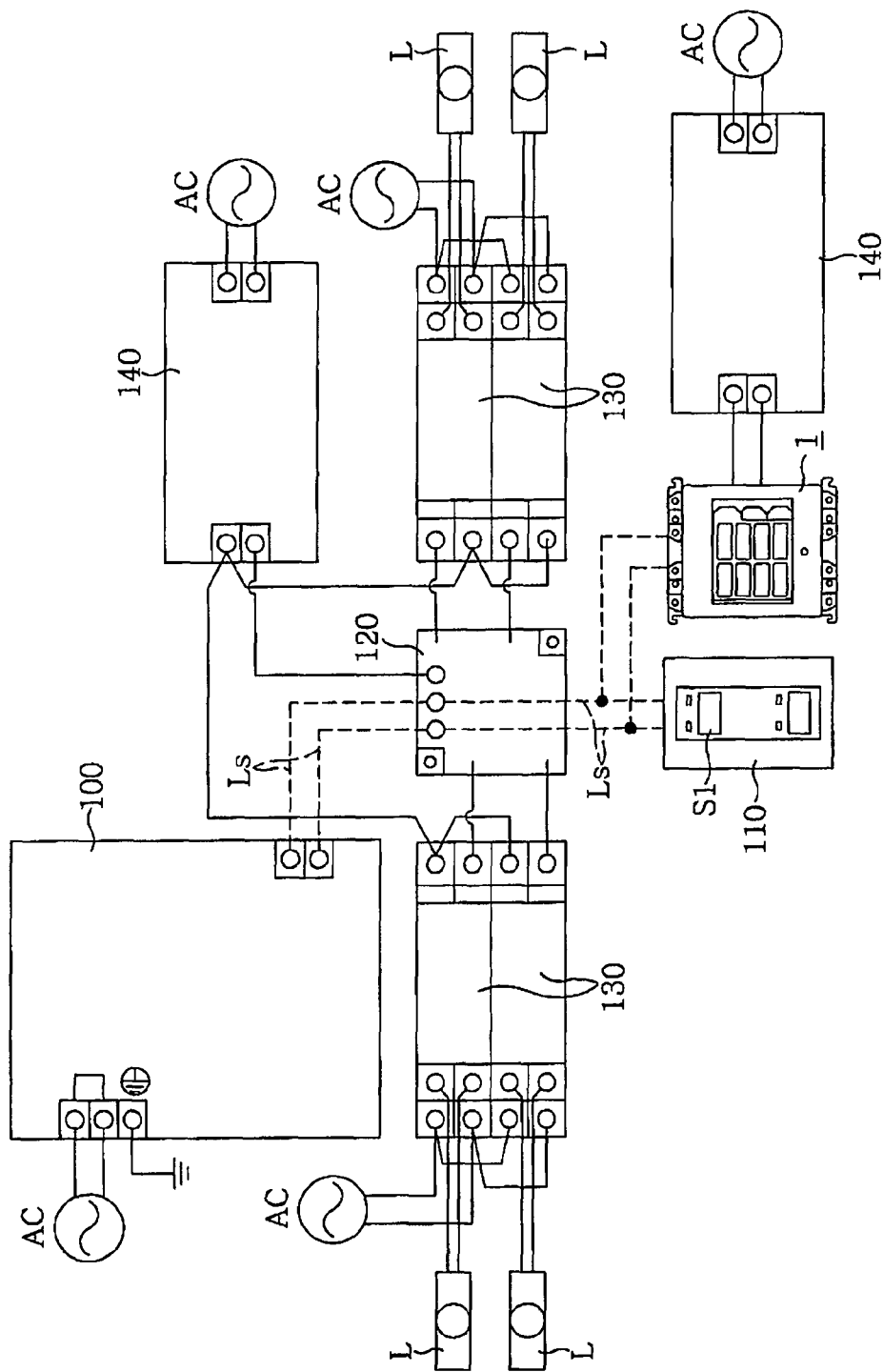
FIG. 21 is a system configuration diagram showing a remote monitoring and control system that makes use of the monitoring and control devices of the seventh and eighth embodiments.

FIG. 21 is a system configuration diagram showing a remote monitoring and control system that makes use of the monitoring and control device (operation terminal) 1 of the present invention. In this remote monitoring and control system, the monitoring and control device 1 of the present invention, the operation terminal 110 provided with a changeover switch S1 for changing over the operation status of the corresponding load L and the control terminal 120 are connected to the transmission unit 30 through the two-wire type signal line Ls in a branched connection method (or in a multi-drop connection method). The control terminal 120 is designed to control a latching type remote-controlled relay 130 for permitting or interrupting the power supply from the commercial alternating current source AC to the load L. Different addresses are allotted to the operation terminals 1 and 110 and the control terminal 120 so that the transmission unit 30 can identify them using the addresses.

Reference numeral 140 in FIG. 21 designates a remote-controlled transformer that derives electric power (of AC 24V) for operating the remote-controlled relay 130, the control terminal 120 and the monitoring and control device 1, from the commercial alternating current source AC. The remote-controlled transformer 140, the transmission unit 30 and the control terminal 120 are mounted to a power distribution board not shown in the drawings. Thus, the power distribution board needs to have a space for accommodating the remote-controlled transformer 140. In addition, a power-feeding line through which to supply the commercial alternating current source AC to the remote-controlled transformer 140 needs to be drawn into the power distribution board.

The body unit 6 is provided on its rear surface with connection terminals T1 to which the power-feeding line leading to the output end of the remote-controlled transformer 140 is connected and connection terminals T2 to which the signal line Ls is connected.

The operation portion 75 for operating the push button switch SW and the LED window 76' for passing the light irradiated from the LED 770 are provided on the front surface of the panel case 70 and below the display window 74. The LED 770 is always turned on while an electric current is supplied to the panel unit 7. The LED 770 is used to notify a user of the position of the monitoring and control device 1 when an indoor space remains dark.

In the monitoring and control device 1 of the present embodiment, the load state (i.e., the operation state of the loads L) acquired by the communication circuit 11 is displayed on the display panel 2. The transmission signal including the monitoring data indicative of the operation of the operation input unit 3 and associated with the display content displayed on the display panel 2 is delivered to the signal line Ls. In other words, the current operating state of the respective loads L to be monitored is displayed on the display panel 2. It is possible for a user to control the loads L by operating the operation input unit 3 according to the display content.

Figure 18:
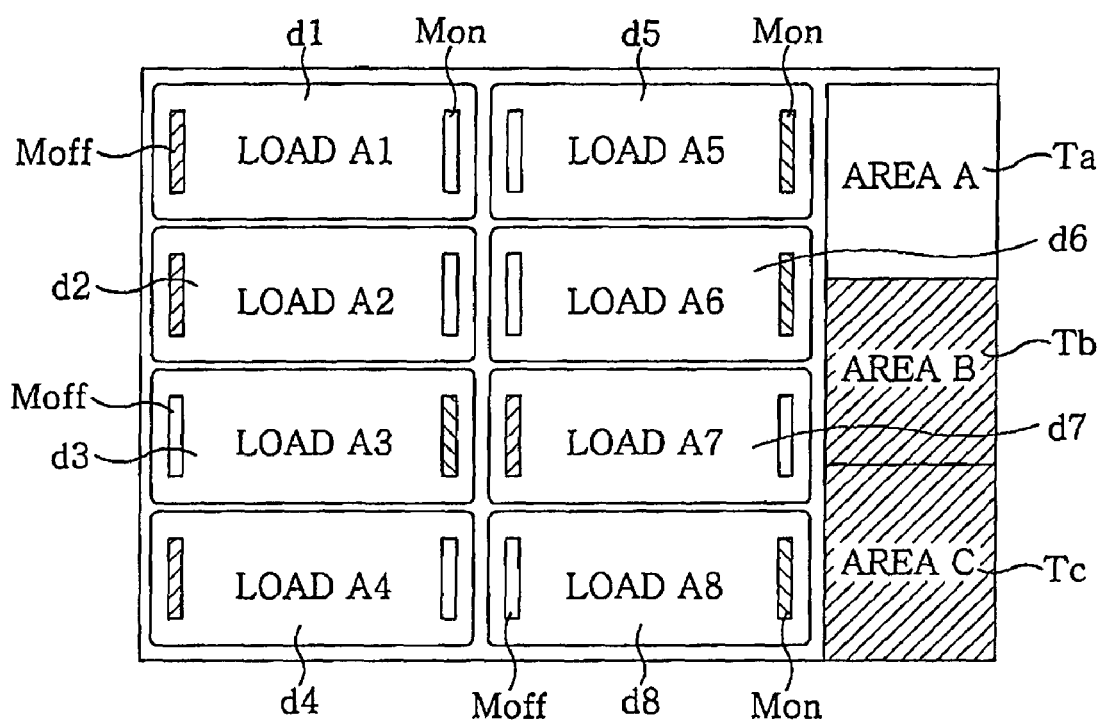
FIG. 18 illustrates one display example in a display panel used in the monitoring and control device.
Figure 19A:
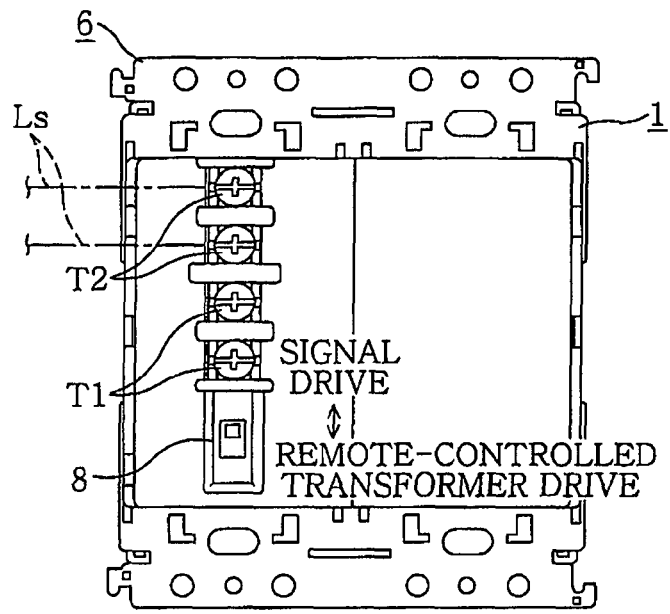
FIGS. 19A and 19B illustrate examples of power supply connection to the monitoring and control device.
Figure 19B:
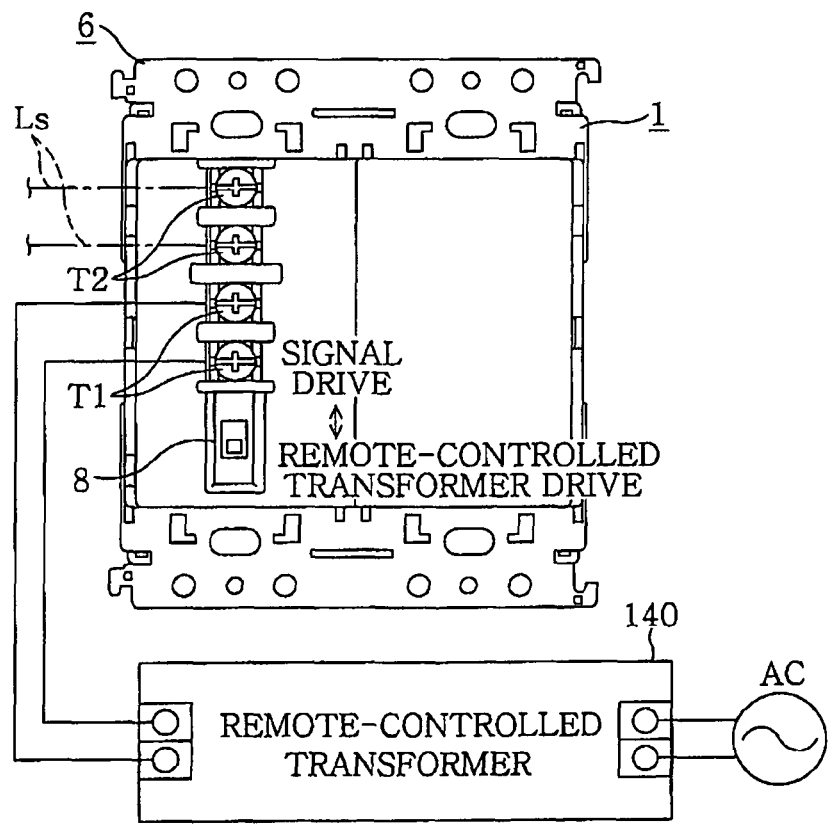

FIG. 18 illustrates one example of the screen page displayed on the screen of the display panel 2. A plurality of operation buttons d1 through d8 corresponding to the loads L to be monitored and controlled is displayed on the screen of the display panel 2. A user can perform the input operation for controlling the loads L, by touching the positions corresponding to the respective operation buttons d1 through d8 of the operation input unit 3 displayed on the display panel 2. For example, the on-off state of the load A1 can be changed over by touching the operation button d1 which reads "LOAD A1". The operation buttons d1 through d8 are capable of indicating the state of the loads L corresponding thereto. If one of the loads L is in an off-state, the off-mark Moff arranged at the left end of each of the operation buttons d1 through d8 is turned on in green. If one of the loads L is in an on-state, the on-mark Mon arranged at the right end of each of the operation buttons d1 through d8 is turned on in red.

The monitoring and control device 1 is designed to monitor and control a multiplicity of loads L. Therefore, if the operation buttons corresponding to the loads L are all displayed on one screen page of the display panel 2, the size of the operation buttons becomes too small. This may possibly make the display of the load state illegible or make it difficult to operate the operation buttons. In the present embodiment, therefore, the number of the operation buttons displayed on one screen page of the display panel 2 is kept relatively small so that the operation buttons corresponding to the loads L can be displayed by changing over the display content. In other words, the loads L to be monitored and controlled are assorted into a plurality of load groups. The load state of each of the load group is displayed on every screen page of the display panel 2. The load group to be displayed is changed over by operating the tabs Ta, Tb and Tc appearing on the right end area of the screen of the display panel 2.

Preferably, the classification of the load groups is made on the basis of the room in which the loads L are installed or the kind of the loads L so that the relevant loads can belong to the same load group. In the present embodiment, the load groups are classified on the basis of the areas A, B and C in which loads L are installed. If the tab Ta reading "AREA A" is selected, the state of the loads A1 through A8 installed in the area A is displayed one screen page. Similarly, if the tab Tb or Tc reading "AREA B" or "area C" is selected, the state of the loads installed in each of the areas B and C is displayed on another screen page.

Figure 16:
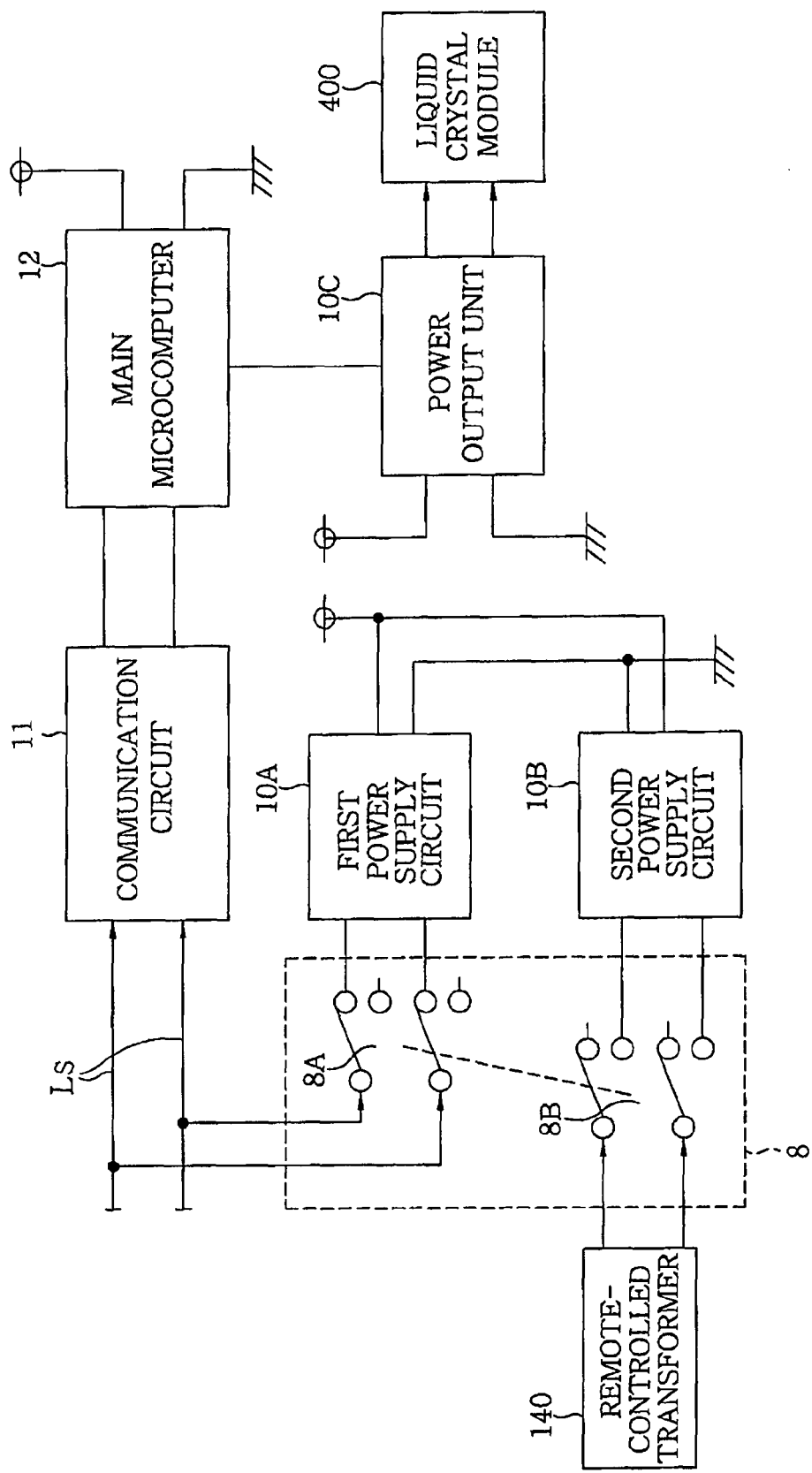
FIG. 16 is a schematic block diagram showing major parts of a monitoring and control device in accordance with a seventh embodiment of the present invention.
Figure 17:
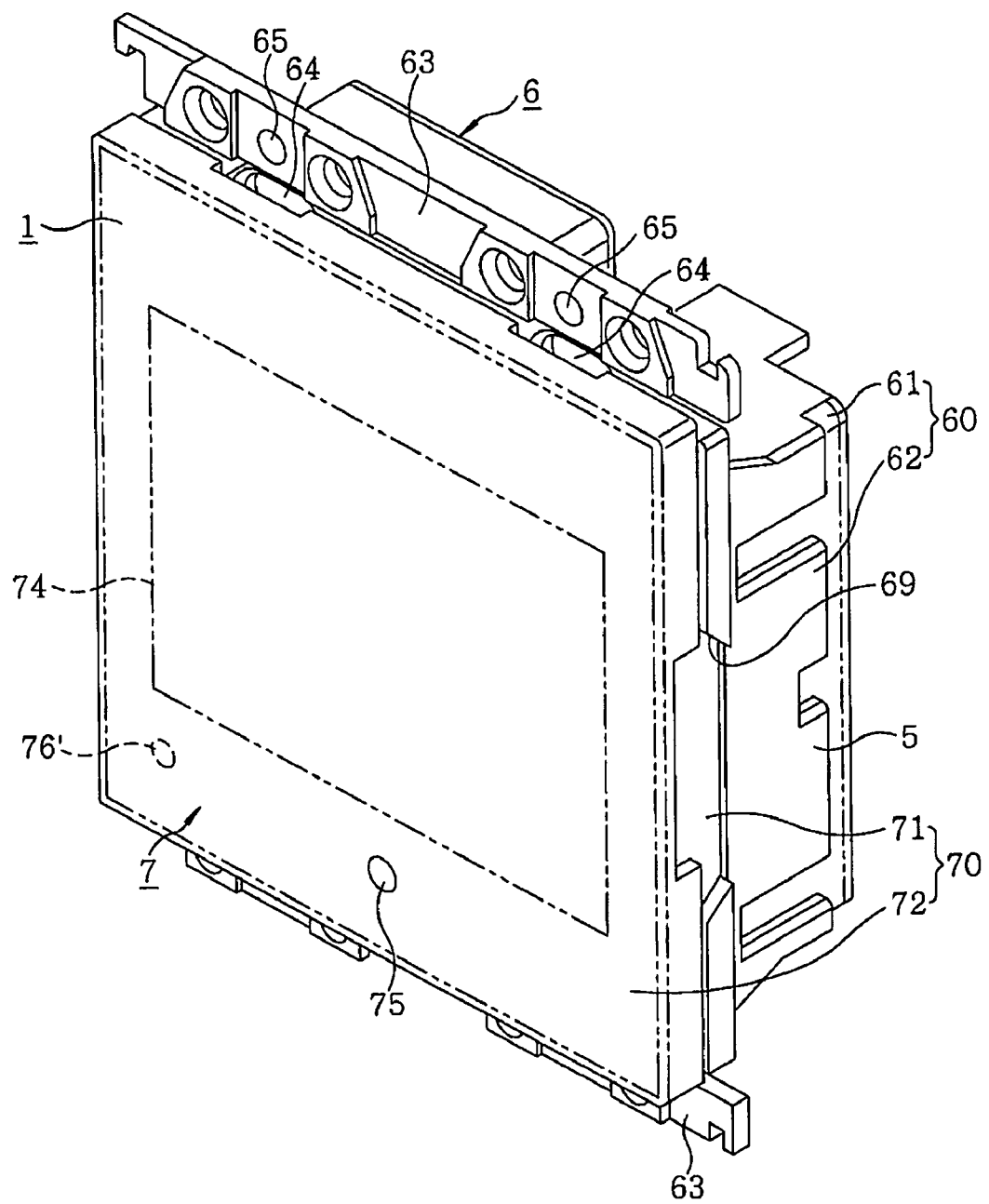
FIG. 17 is a perspective view showing the outward appearance of the monitoring and control device.

In the monitoring and control device 1 of the present embodiment, as shown in FIG. 16, the power supply circuit 10 for generating internal electric power includes a first power supply circuit 10A for generating the internal electric power from the transmission signal transmitted through the signal line Ls and a second power supply circuit 10B for generating the internal electric power from the alternating current (of AC 24V) supplied through the remote-controlled transformer 140. One of the first power supply circuit 10A and the second power supply circuit 10B is selected by a changeover switch (or a changeover unit) 8 formed of a slide switch and arranged on the rear surface of the body unit 6 as shown in FIGS. 20A and 20B.

If the changeover switch 8 is slid upwards as shown in FIG. 20A, the contact point 8A is turned on but the contact point 8B is turned off in response to the operation of the changeover switch 8. Thus, the first power supply circuit 10A is selected. If the changeover switch 8 is slid downwards as shown in FIG. 20B, the contact point 8A is turned off but the contact point 8B is turned on in response to the operation of the changeover switch 8. Thus, the second power supply circuit 10B is selected. The internal electric power generated in the first power supply circuit 10A or the second power supply circuit 10B thus selected is supplied from the power output unit 10C to the main microcomputer, the liquid crystal module 4 and so forth. In the present embodiment, the liquid crystal module 4 is composed of the display panel 2, the operation input unit 3, the liquid crystal controller 15, the contrast adjusting unit 17 and the backlight inverter circuit 18.

In case where the internal electric power is generated by the first power supply circuit 10A, the signal line Ls is connected to the connection terminals T2 as illustrated in FIG. 20A. In the event that the internal electric power is generated by the second power supply circuit 10B, the power supply line leading from the remote-controlled transformer 140 needs to be connected to the connection terminals T2 while the signal line Ls is connected to the connection terminals T2, as illustrated in FIG. 20B.

With the present embodiment, the internal electric power required in the monitoring and control device 1 can be generated from the transmission signal inputted through the signal line Ls, if a small amount of electric current is consumed by other terminals than the monitoring and control device 1 connected to the same signal line Ls (e.g., the operation terminal 100 and the control terminal 120 in the present embodiment). In this case, it becomes unnecessary to employ the remote-controlled transformer 140 for supplying electric power to the monitoring and control device 1. As a result, there is no need to provide the space for accommodating the remote-controlled transformer 140 and to perform the task of extending the power supply line into the remote-controlled transformer 140. This makes it possible to reduce the size of the power distribution board and the number of installation steps. Even if an increased amount of electric current is consumed by other terminals than the monitoring and control device 1 connected to the same signal line Ls and even if the internal electric power required in the monitoring and control device 1 cannot be generated from the transmission signal inputted through the signal line Ls, it is possible to easily select the remote-controlled transformer 140 by operating the changeover switch 8 so that the electric power can be supplied from the remote-controlled transformer 140. Even if the power supply line is not extended into the remote-controlled transformer 140 when the existing system is replaced by the monitoring and control device 1, the replacement task can be easily performed by operating the changeover switch 8 to select the power supply from the transmission signal.

Although the first and second power supply circuits 10A and 10B are changed over by the changeover switch 8 formed of a slide switch in the present embodiment, the changeover unit is not limited thereto. As an alternative example, the first and second power supply circuits 10A and 10B may be changed over by performing an input operation with the operation input unit 3.

Eighth Embodiment

Figure 20:
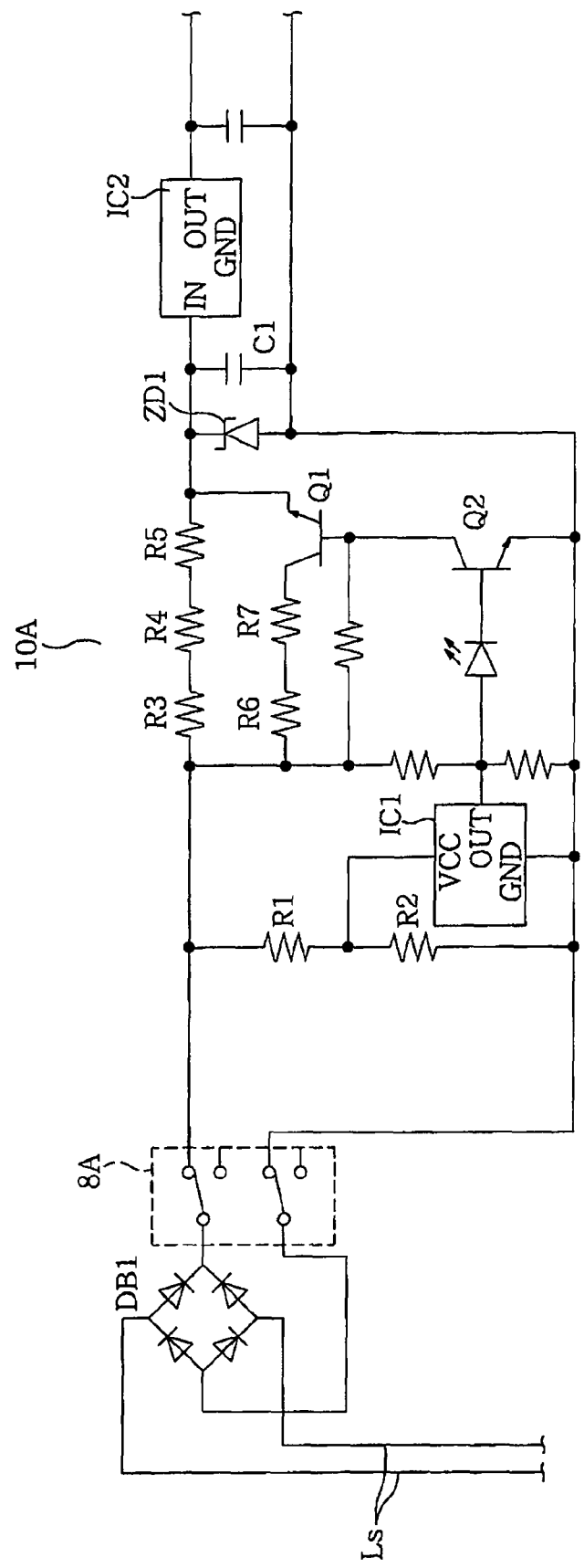
FIG. 20 is a circuit diagram showing major parts of a monitoring and control device in accordance with an eighth embodiment of the present invention.

A monitoring and control device 1 in accordance with an eighth embodiment of the present invention will now be described with reference to FIG. 20. As distinguished from the seventh embodiment in which one of the first and second power supply circuits 10A and 10B is selected as the power supply circuit for generating internal electric power, the present embodiment employing the configuration of the seventh embodiment is characterized in that, when the first power supply circuit 10A is selected, the electric current inputted to a three-terminal regulator 102 to be described later is adjustable depending on the voltage level of the direct current generated from the transmission signal inputted through the signal line Ls. Other configurations of the present embodiment remain the same as those of the seventh embodiment. The same component parts as those of the seventh embodiment will be designated by like reference characters and will be omitted from description.

The monitoring and control device 1 of the present embodiment includes a power supply circuit 10A. As its major components, the first power supply circuit 10A includes a resistor-type voltage drop circuit for dropping the voltage of the direct current generated from the transmission signal inputted through the signal line Ls, a three-terminal regulator circuit IC2 for converting the direct current, the voltage of which has been dropped by the resistor-type voltage drop circuit, to a direct current of specified voltage value, and an impedance converter unit for detecting the voltage level of the direct current generated from the transmission signal and for, if the voltage level detected is smaller than a specified threshold value, converting the impedance value of drop resistors of the resistor-type voltage drop circuit to an impedance value lower than that available when the voltage level is equal to or greater than the specified threshold value.

The resistor-type voltage drop circuit includes a first serial circuit having resistors R3, R4 and R5 serially connected to one another, a second serial circuit having resistors R6 and R7 serially connected to each other, a zener diode ZD1 serially connected to the first serial circuit and a capacitor C1 parallel-connected to the zener diode ZD1. The second serial circuit is parallel-connected to the first serial circuit through a transistor Q1. The zener diode ZD1 has an overvoltage protection function.

The impedance converter unit includes a voltage detector IC1 for detecting the voltage level of the direct current generated by rectifying the transmission signal inputted through the signal line Ls with a rectifier DB1, and transistors Q1 and Q2 that are turned on or off depending on the detection result of the voltage detector IC1. The voltage detector IC1 of the present embodiment detects the divided voltage level at the connection point of the resistors R1 and R2 as the voltage level of the direct current. The voltage detector IC1 is configured to output an on-signal for turning on the transistor Q2, if the divided voltage level is smaller than a predetermined threshold value, but not to output the on-signal, if the divided voltage level is equal to or higher than the predetermined threshold value.

With the power supply circuit 10A described above, the transistors Q1 and Q2 remain turned off if the divided voltage level detected by the voltage detector IC1 is determined to be equal to or greater than the predetermined threshold value. In this case, the resistor-type voltage drop circuit is formed of the first serial circuit (i.e., the resistors R3, R4 and R5), the zener diode ZD1 and the capacitor C1. Thus, the impedance value of the drop resistors becomes equal to the synthetic impedance value of the resistors R3, R4 and R5. This means that the drop resistors are formed of the resistors R3, R4 and R5.

The transistors Q1 and Q2 are turned on by the on-signal supplied from the voltage detector IC1 if the divided voltage level detected by the voltage detector IC1 is determined to be smaller than the predetermined threshold value. In this case, the resistor-type voltage drop circuit is formed of the parallel circuit of the first and second serial circuits (i.e., the parallel circuit of the resistors R3, R4 and R5 and the resistors R6 and R7), the zener diode ZD1 and the capacitor C1. Thus, the impedance value of the drop resistors becomes equal to the synthetic impedance value of the resistors R3 through R7. This means that the drop resistors are formed of the resistors R3 through R7. Since the first serial circuit having the resistors R3, R4 and R5 is parallel-connected to the second serial circuit having the resistors R6 and R7, the total impedance value of the drop resistors is smaller than the impedance value only for the first serial circuit.

The voltage inputted to the three-terminal regulator circuit IC2 for generating the internal electric power (namely, the voltage inputted to a terminal IN shown in FIG. 20) is set lower than the voltage inputted to the power supply circuit 10A. Therefore, the voltage inputted to the three-terminal regulator circuit 102 needs to be dropped to a specified voltage level. In the present embodiment, the voltage drop is performed by the drop resistors. In an instance where the level of the transmission signal inputted to the power supply circuit 10A grows smaller due to the increased distance between the transmission unit 30 and the monitoring and control device 1, the electric current inputted to the three-terminal regulator circuit 102 is reduced if the drop resistance remains constant. In this case, there is a possibility that it becomes impossible to obtain a desired internal electric power.

With the present embodiment described above, the divided voltage level is detected by the voltage detector IC1. If the divided voltage level is determined to be smaller than the predetermined threshold value, the impedance value of the drop resistors is converted to a relatively low impedance value, thereby preventing reduction of the electric current inputted to the three-terminal regulator circuit 102. As a result, it is possible for the three-terminal regulator circuit IC2 to obtain a desired internal electric power.

In the present embodiment, the resistance values of the resistors R3 through R7 are set so that the total heat loss can be reduced by balancing the heat loss in the drop resistors and the heat loss in the three-terminal regulator circuit 102.

In the power supply circuit 10A of the present embodiment, the resistance values of the drop resistors are set so that the total heat loss can be reduced by balancing the heat loss in the drop resistors and the heat loss in the three-terminal regulator circuit IC2. In an instance where the level of the transmission signal inputted to the monitoring and control device 1 grows smaller due to the wiring resistance generated by the increased distance between the transmission unit 30 and the monitoring and control device 1, the impedance value of the drop resistors is converted to a relatively low impedance value. This makes it possible to prevent reduction of the electric current inputted to the three-terminal regulator circuit IC2 while reducing the heat loss. Accordingly, it is possible to obtain the desired internal electric power required in the monitoring and control device 1.

Although the resistor-type voltage drop circuit is formed of the first and second serial circuits, the zener diode ZD1 and the capacitor C1 in the present embodiment, the present invention is not limited to the resistor-type voltage drop circuit of the present embodiment. The resistor-type voltage drop circuit may have any other configuration as long as it can reduce the impedance value when the level of the transmission signal inputted to the power supply circuit 10A is low. Although the impedance converter unit is formed of the voltage detector IC1 and the transistors Q1 and Q2 in the present embodiment, the present invention is not limited to the impedance converter unit of the present embodiment. The resistor-type voltage drop circuit and the impedance converter unit may be consolidated into a single unit.

Ninth Embodiment

A monitoring and control device in accordance with a ninth embodiment of the present invention will now be described with reference to FIGS. 22 through 25. The same component parts as those of the first embodiment will be designated by like reference characters and will be omitted from description.

The monitoring and control device of the present embodiment includes the body unit 6 provided with a substrate 1053b (see FIG. 24), the panel unit 7 provided with the operation input unit 3 and the display panel 2 and detachably attached to the body unit 6 by a coupling unit to be described later, and a frame-like decoration plate 1030 for hiding an installation cavity.

The decoration plate 1030 includes a plate frame 1031 fixed to an attachment plate 1040 by plate screws for covering and hiding the installation cavity and the attachment plate 1040, and a plate cover 1032 for hiding the plate screws. The plate frame 1031 is made of a metallic material, while the plate cover 1032 is made of a synthetic resin material.

The plate frame 1031 includes a front plate portion 1031*a* having a quadrate front surface, and a plurality of holder pieces 1031*b* extending backwards from the end surface of the front plate portion 1031*a* and surrounding the peripheral surface of a panel body 71. The front plate portion 1031*a* of the plate frame 1031 has a frame-side exposure window 1061*a* through which to expose the front surface of the panel unit 7 and a plurality of through-holes 1060 into which the plate screws are inserted from the front side.

The plate cover 1032 includes a front wall portion 1032*a* for covering the front surface of the plate frame 1031 and a peripheral wall portion 1032*b* for surrounding the plate frame 1031 in an opposing relationship with the holder pieces 1031*b*. The plate cover 1032 is fitted to the plate frame 1031 from the front side of the plate frame 1031 while allowing the peripheral wall portion 1032*b* to make sliding contact with the holder pieces 1031*b* of the plate frame 1031. The plate cover 1032 is held in the plate frame 1031 by the frictional force acting between the holder pieces 1031*b* of the plate frame 1031 and the peripheral wall portion 1032*b* of the plate cover 1032.

The front wall portion 1032*a* of the plate cover 1032 has a cover-side exposure window 1061*b* through which to expose the front surface of the panel unit 7. The cover-side exposure window 1061*b* is formed to have substantially the same size as that of the front surface of the panel body 71 so that the panel body 71 can be fitted to the cover-side exposure window 1061*b* with no gap left therebetween.

Figure 25:
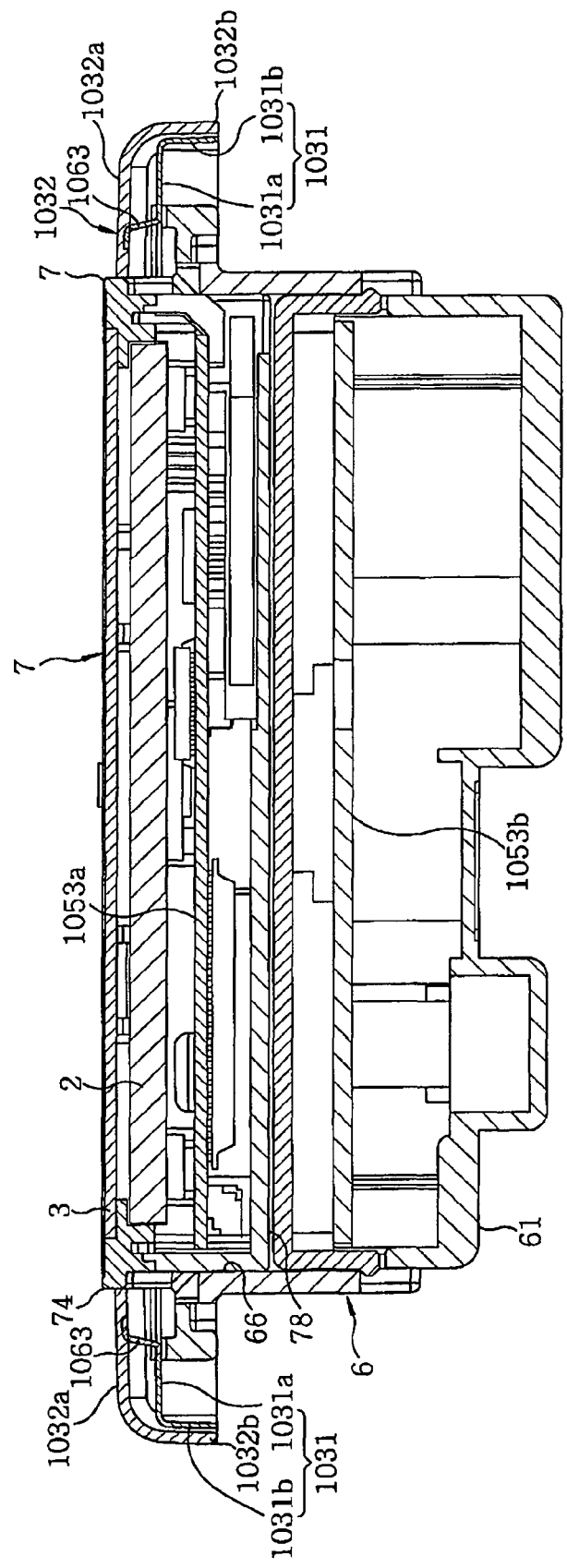
FIG. 25 is a horizontal section view of the monitoring and control device of the ninth embodiment.
Figure 26:
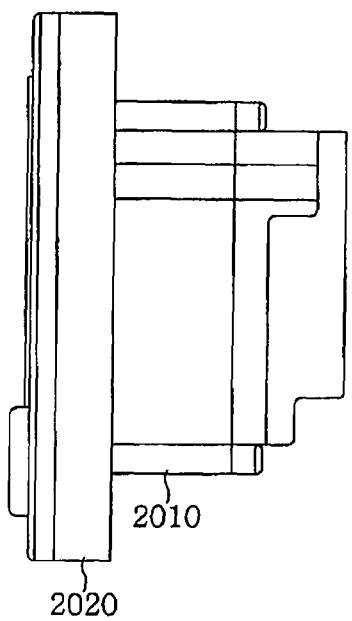
FIG. 26 is a side view showing a conventional monitoring and control device.
Figure 27:
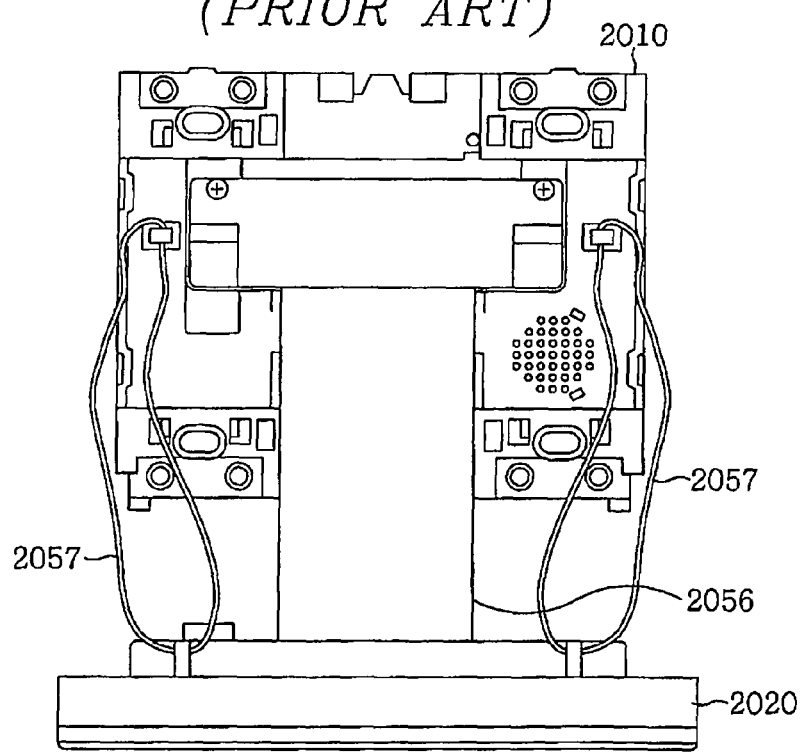
FIG. 27 is an exploded view of the conventional monitoring and control device.

Spacers 1063 protrude forwards from the front plate portion 1031*a* of the plate frame 1031 to make contact with the rear surface of the front wall portion 1032*a* of the plate cover 1032. As shown in FIG. 25, the spacers 1063 come into contact with the rear surface of the front wall portion 1032*a* of the plate cover 1032 in such positions where the front wall portion 1032*a* of the plate cover 1032 surrounds the front end portion of the peripheral surface intersecting the front surface of the panel body 71.

Figure 22:
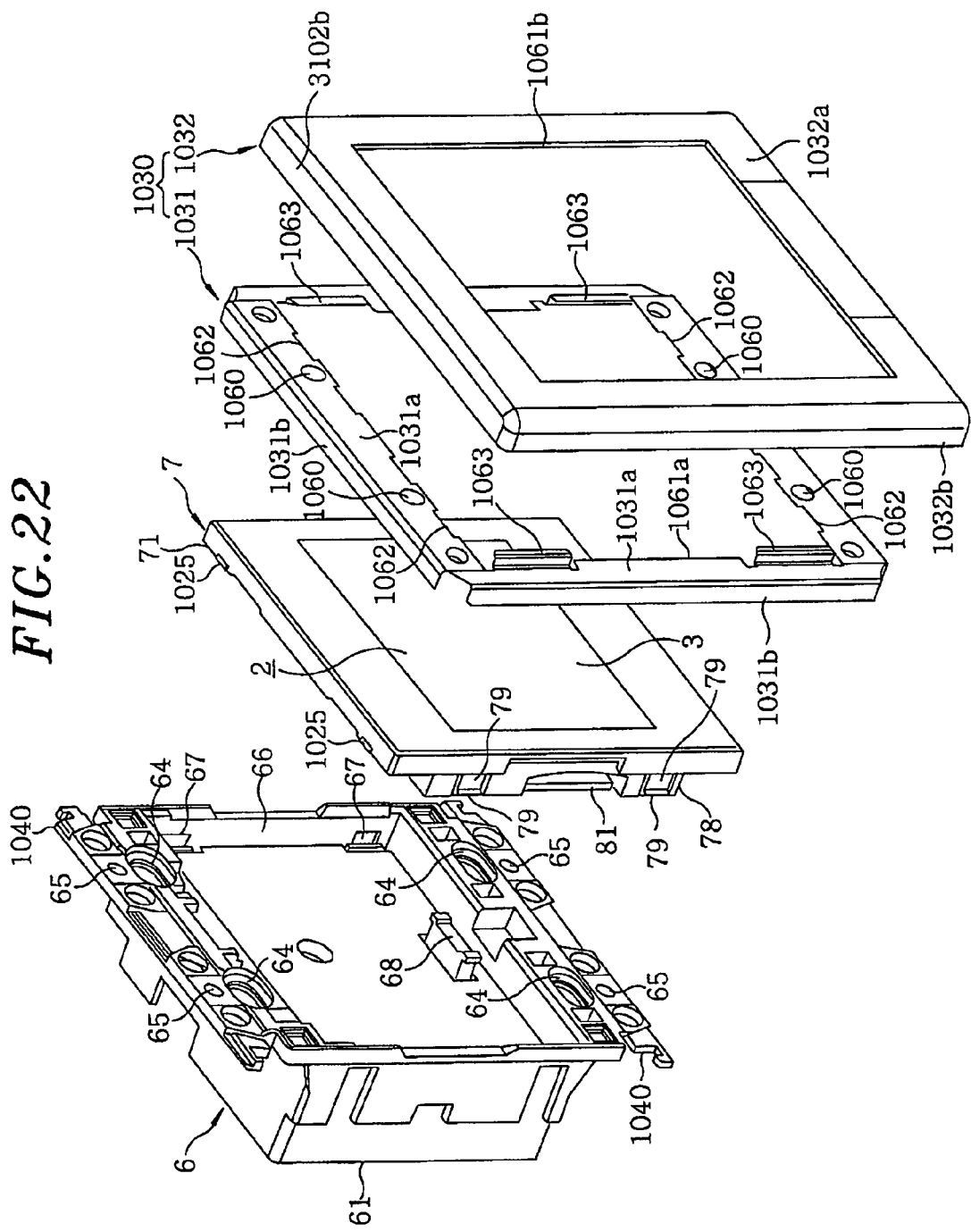
FIG. 22 is an exploded perspective view showing a monitoring and control device in accordance with a ninth embodiment of the present invention as seen from the front side thereof.
Figure 23:
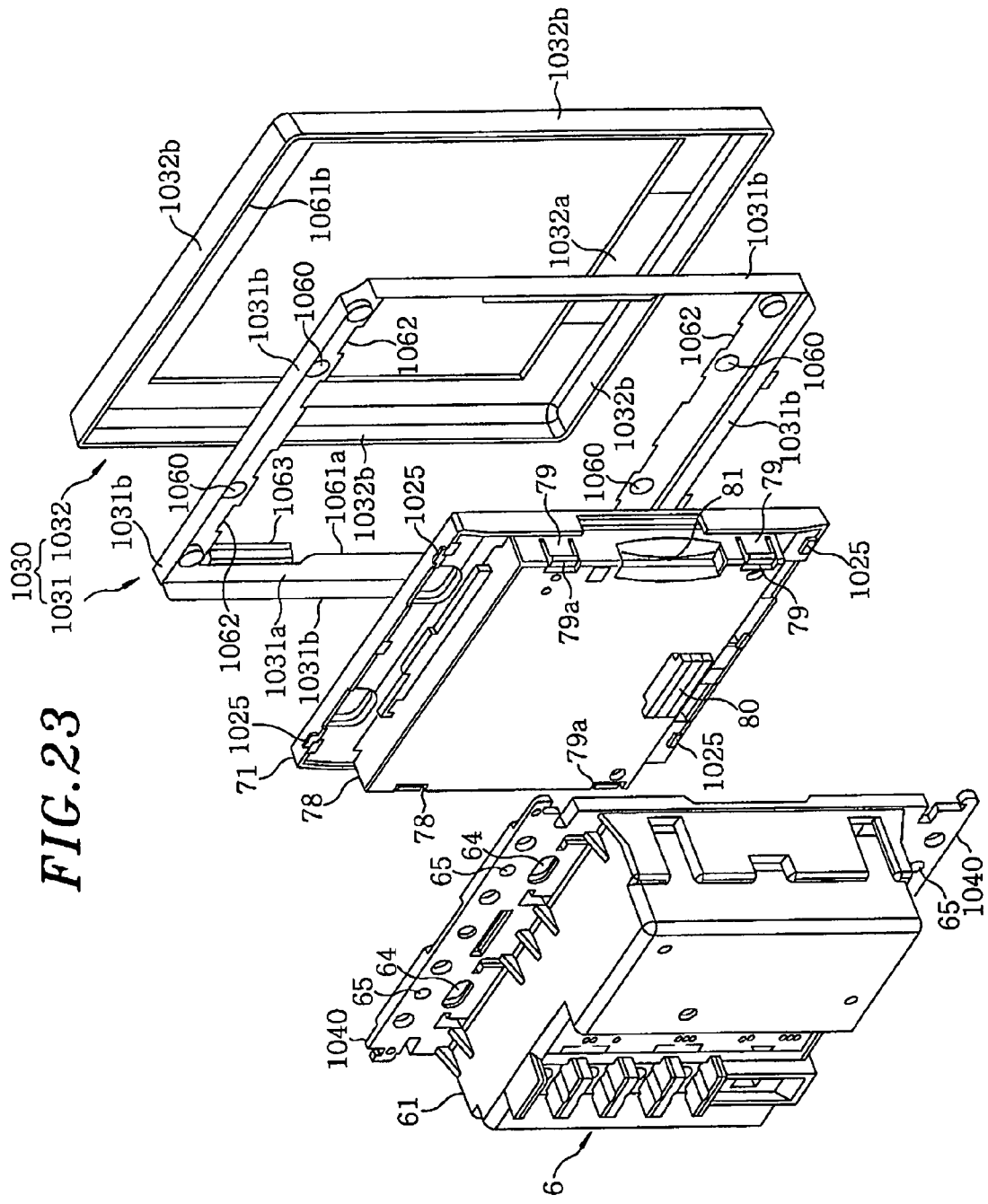
FIG. 23 is an exploded perspective view showing the monitoring and control device of the ninth embodiment as seen from the rear side thereof.
Figure 24:
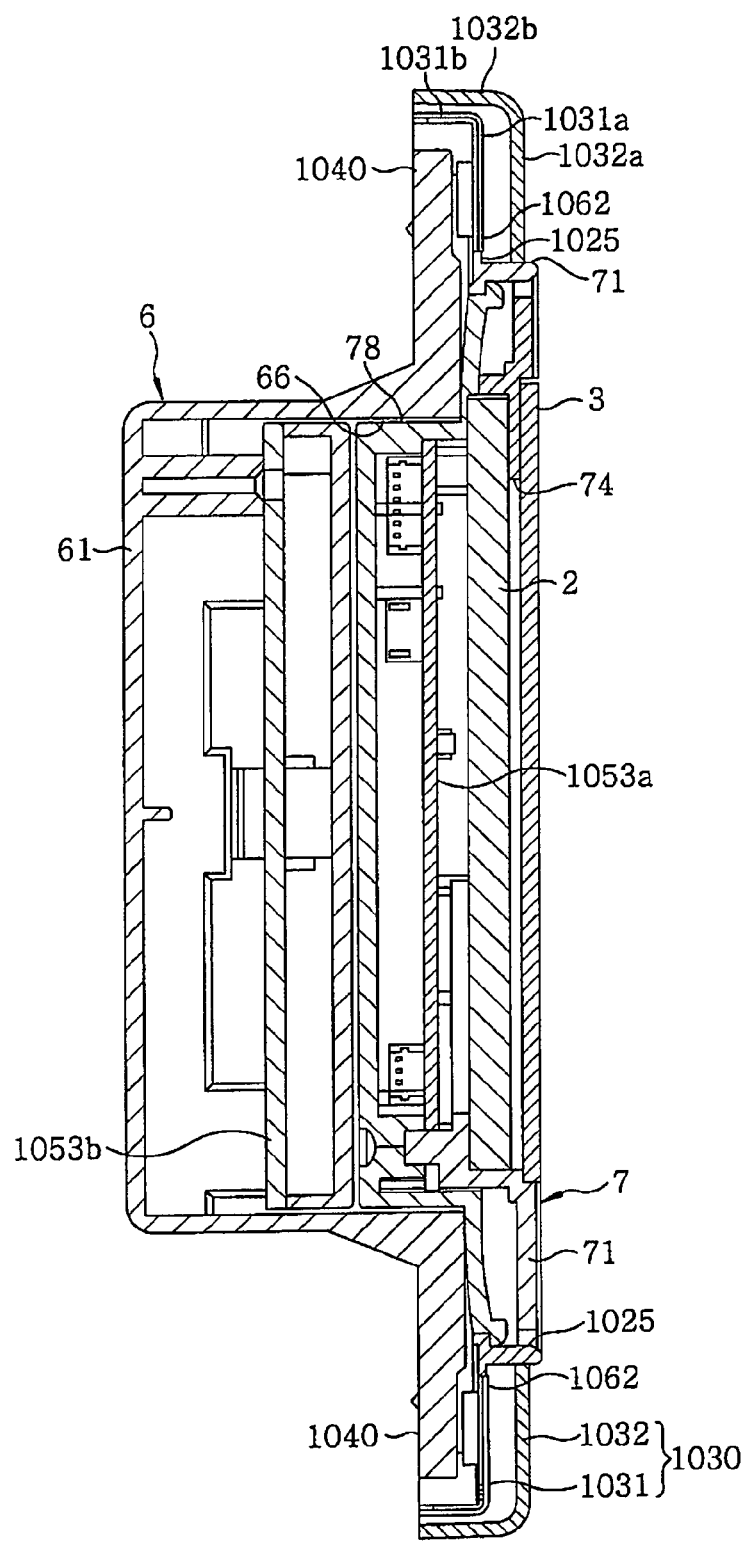
FIG. 24 is a vertical section view of the monitoring and control device of the ninth embodiment.

In the present embodiment, as shown in FIGS. 22 and 23, drop-preventing lugs 1025 protrude from the upper and lower peripheral surfaces of the panel body 71 so that the locking claws 79*a* should not removed from the locking holes 67 and the panel unit 7 should not dropped to the floor by the impact applied to the wall, e.g., when the door attached to the wall is opened or closed. The drop-preventing lugs 1025 are formed in the rear end portion of the peripheral surfaces of the panel body 71. In other words, the drop-preventing lugs 1025 are formed rearwards of the front wall portion 1032*a* in a spaced-apart relationship with the front wall portion 1032*a* of the plate cover 1032.

As described above, the panel body 71 is fitted to the cover-side exposure window 1061*b* of the plate cover 1032 with no gap left therebetween. Therefore, if the locking claws 79*a* are removed from the locking holes 67 and the panel unit 7 is moved forwards, the front surfaces of the drop-preventing lugs 1025 make contact with the rear surface of the front wall portion 1032*a* of the plate cover 1032, thus preventing the panel unit 7 from dropping on the floor.

Cutout holes 1062 are formed in the front plate portion 1031*a* of the plate frame 1031 in alignment with the drop-preventing lugs 1025 so that the drop-preventing lugs 1025 do not hinder the attachment and detachment of the panel unit 7 with respect to the body unit 6. Therefore, if the plate cover 1032 is removed from the plate frame 1031, it becomes possible to attach or detach the panel unit 7 with respect to the body unit 6 without having to remove the plate frame 1031 from the body unit 6 (namely, without having to remove the plate screws).

In the present embodiment described above, the panel unit 7 can be attached and detached to and from the body unit 6 by merely moving the panel unit 7 backwards. As compared to the conventional configuration provided with drop-preventing ropes, this facilitates the installation task of attaching the monitoring and control device to the wall. The panel unit 7 can be placed in a position for maintenance and repair by merely pulling the plate cover 1032 forwards to remove the same from the plate frame 1031 and then pulling the panel unit 7 forwards to remove the same from the body unit 6 (without having to remove the plate frame 1031 from the body unit 6). This makes it easy to perform a maintenance task.

Although the drop-preventing lugs 1025 are formed to protrude from the upper and lower peripheral surfaces of the panel body 71 in the configuration described above, they may be formed on the left and right peripheral surfaces of the panel body 71. If the locking claws 79*a* are removed from the locking holes 67, the upper portion of the panel unit 7 tends to fall toward the plate cover 1032. With the configuration in which the drop-preventing lugs 1025 are formed on the upper and lower peripheral surfaces of the panel body 71, therefore, the drop of the panel unit 7 is prevented primarily by the drop-preventing lug 1025 formed on the upper peripheral surface of the panel body 71. In case where the drop-preventing lugs 1025 are formed on the left and right peripheral surfaces of the panel body 71, the falling force of the panel unit 7 is dispersed on the left and right peripheral surfaces. This makes it possible to reliably prevent the drop of the panel unit 7.

Alternatively, the drop-preventing lugs 1025 may be formed on the upper, lower, left and right peripheral surfaces of the panel body 71. With this configuration, the falling force of the panel unit 7 acting toward the plate cover 1032 is more evenly dispersed than in the configuration in which the drop-preventing lugs 1025 are formed only on the upper and lower peripheral surfaces or the left and right peripheral surfaces of the panel body 71.

As a further alternative, the drop-preventing lugs 1025 may be formed on the entire peripheral surfaces of the panel body 71. With this configuration, the falling force of the panel unit 7 acting toward the plate cover 1032 is more evenly dispersed than in the configuration in which the drop-preventing lugs 1025 are formed on the upper, lower, left and right peripheral surfaces of the panel body 71.

In the configuration described above, the drop-preventing lugs 1025 are spaced apart from the front wall portion 1032*a* of the plate cover 1032 so that the drop-preventing lugs 1025 can make contact with the front wall portion 1032*a* of the plate cover 1032 when the locking claws 79*a* are removed from the locking holes 67 and the panel unit 7 is moved forwards. Alternatively, it may be possible to employ a configuration in which the front surfaces of the drop-preventing lugs 1025 remain in contact with the rear surface of the front wall portion 1032*a* of the plate cover 1032 at all times. With this configuration, the contact between the drop-preventing lugs 1025 and the front wall portion 1032*a* of the plate cover 1032 assists in holding the panel unit 7 in the body unit 6. This helps prevent the locking claws 79*a* from being removed out of the locking holes 67, which makes it possible to prevent the drop of the panel unit 7.

In an effort to have the plate cover 1032 held in the plate frame 1031 with an increased holding force and to reliably prevent the drop of the panel unit 7, it may be possible to employ a configuration in which attachment claws for snap-fit coupling are formed on the inner surfaces of the peripheral wall portion 1032*b* of the plate cover 1032 and in which attachment holes for engagement with the attachment claws are formed in the holder pieces 1031*b* of the plate frame 1031. In this case, the attachment claws are formed into a triangular shape just like the locking claws 79*a* so that the plate cover 1032 can be removed from the plate frame 1031 by merely pulling the plate cover 1032 forwards.

In the present embodiment, the plate frame 1031 is made of a metallic material while the plate cover 1032 is made of a synthetic resin material. Alternatively, the plate frame 1031 may be made of a synthetic resin material and the plate cover 1032 may be made of a metallic material.

While the invention has been shown and described with respect to the embodiments, it will be understood by those skilled in the art that various changes and modifications may be made without departing from the scope of the invention as defined in the following claims.

What is claimed is:

1. A monitoring and control device for use in a remote monitoring and control system that monitors and controls loads through communications, the device comprising:
    a display panel for displaying a graphic image on a screen thereof;
    an operation input unit through which a user carries out input operation;
    a control unit for performing a load control in accordance with the input operation of the user related to the graphic image displayed on the display panel and for allowing the display panel to display the graphic image in accordance with states of the loads;
    a communication circuit for transmitting a load control signal;
    a device housing having a socket located behind the display panel, an external storage medium including a rewritable memory being removably mounted in the socket and the device housing being attached in an attachment hole formed in a wall in a state that the external storage medium is mounted in the socket,
    wherein the control unit performs a setting operation for the graphic image displayed on the display panel and for the load control in accordance with setting information stored in the external storage medium; and
    wherein the external storage medium is inserted in the socket through an insertion slot formed in a side portion of the device housing, at least a portion of the insertion slot being received in the attachment hole in a state that the device housing is attached to the wall.

2. The device of claim 1, wherein the operation input unit includes a transparent touch switch superimposed on a front surface of the display panel, a circuit board is disposed behind the display panel in the device housing, and the socket is mounted on a rear surface of the circuit board.

3. The device of claim 1, wherein the device housing includes a body case fixed to the wall in such a way that a rear portion of the body case is received in the attachment hole and a panel case detachably attached to a front portion of the body case, a front portion of the panel case being protruded forwardly from a surface of the wall while the device housing is attached to the wall,
    wherein the body case includes therein at least a power supply circuit for outputting a drive power and the communication circuit to constitute a body unit and the panel case includes therein at least the display panel and the operation input unit to constitute a panel unit, and
    wherein the insertion slot is formed in the panel case.

4. The device of claim 3, wherein the body case has a coupling recess portion whose bottom surface is located backwards of the wall surface and the panel case has a coupling protrusion portion fitted in the coupling recess portion, one of the inner surface of the coupling recess portion and the side surface of the coupling protrusion portion has locking pieces engaged in locking holes provided in the other.

5. The device of claim 4, wherein the panel case has side portions extending backwardly from a pair of opposite sides of a substantially rectangular front surface of the panel case and recesses are formed in the respective side portions.

6. The device of claim 5, wherein side walls of the coupling recess portion of the body case have forwardly opened cut-outs at positions corresponding to the recesses of the panel case.

7. The device of claim 3, wherein the panel unit includes, in the panel case, a board on a front surface of which a push button switch is mounted, a portion of a rear surface of the board, which corresponds to the push button switch, is exposed to outside through a through-hole formed in a rear wall of the panel case, the body unit has a contact surface opposed to the portion of the rear surface of the board corresponding to the push button switch.

8. The device of claim 3, wherein the body unit includes a body-side connector provided at the front surface thereof and the panel unit includes a panel-side connector provided opposite to the body-side connector, the body unit and the panel unit being electrically connected to each other by connecting the panel-side connector with the body-side connector, at least one of the body-side connector and the panel-side connector being displaceable within a specified range with respect to the device housing in a plane along the wall surface.

9. The device of claim 3, wherein the body unit includes a body-side connector provided at the front surface thereof and the panel unit includes a panel-side connector provided opposite to the body-side connector, the body unit and the panel unit being electrically connected to each other by connecting the body-side connector with the panel-side connector,
    wherein the panel unit is supplied with the power from the power supply circuit through the connectors when it is coupled with the body unit, and
    wherein the body unit further includes at least one detection power source for supplying an electric current to at least one detection circuit connected to the panel-side connector when the connectors are connected to each other, a detection unit that detects the connection between the connectors when a potential at a connection point between the detection power source and the body-side connector is changed by the current flowing through the detection circuit, and a power supply control unit that turns on the power supply to the panel unit when the detection unit detects the connection between the connectors.

10. The device of claim 9, wherein the detection unit detects the disconnection between the connectors when the potential is changed by interrupting the electric current flowing to the detection circuit, and the power supply control unit turns off the power supply to the panel unit when the detection unit detects the disconnection between the connectors.

11. The device of claim 9, wherein the detection circuit is provided in plural number and the detection circuits are connected at a plurality of points to the panel-side connector, and the detection unit detects the connection between the connectors when the electric current flows to all of the detection circuits.

12. The device of claim 11, wherein the detection circuits are connected to each other in series, and the detection unit detects the connection between the connectors when the potential is changed by the electric current flowing to the detection circuits.

13. The device of claim 11, wherein the detection power source is provided for each detection circuit so that the electric current is allowed to flow from the detection power sources to the respective detection circuits, and the detection unit monitors the change of the potential for each detection circuit and detects the connection between the connectors by taking a logical multiply of the monitoring results.

14. The device of claim 3, wherein the body unit includes a body-side connector provided at the front surface thereof and the panel unit includes a panel-side connector provided opposite to the body-side connector and an ending operation part, the body unit and the panel unit being electrically connected to each other by connecting the body-side connector with the panel-side connector,
wherein the panel unit is supplied with a power from the power supply circuit through the connectors when it is coupled with the body unit, and
wherein the body unit further includes a power supply control unit that turns off the power supply to the panel unit in response to the operation of the ending operation part when the panel unit is attached to the body unit.

15. The device of claim 14, wherein the ending operation part includes an ending switch having an operation member provided on a surface of the panel unit which is exposed to outside in the state that the panel unit is attached to the body unit, and the power supply control unit that turns off the power supply to the panel unit in response to the operation of the operation member of the ending switch.

16. The device of claim 14, wherein the operation input unit also serves as the ending operation part.

17. The device of claim 15, wherein the panel unit has an attachment part that is mechanically coupled to the body unit and released from the body unit by manipulating a release button provided at a peripheral surface of the panel unit extending perpendicular to the front surface thereof, and the release button also serves as the operation member of the ending switch.

18. The device of claim 15, wherein the panel unit has a light indication member that is turned on in response to the power supply from the power supply circuit.

19. The device of claim 3, wherein the display panel displays operation buttons on the screen thereof, the operation input unit receives the input operation using the operation buttons, a transmission communication unit transmits a transmission signal including monitoring data in response to the input operation, and the power supply circuit includes a first power supply circuit generating an internal electric power from the transmission signal transmitted through a signal line, a second power supply circuit generating the internal electric power from the power supplied through a remote-controlled transformer provided at the outside and a changeover unit for selecting one of the first and the second power supply circuit.

20. The device of claim 19, wherein the first power supply circuit includes a voltage drop circuit for dropping the voltage of a DC power generated from the transmission signal inputted through the signal line, a regulator circuit for converting the dropped DC power into a DC power of a specific voltage, and an impedance varying unit for detecting a voltage level of the DC power generated from the transmission signal and for, when the detected voltage level is lower than a threshold value, varying an impedance of a drop resistor in the voltage drop circuit to a lower value than that available when the detected voltage level is equal to or greater than the threshold value.

21. The device of claim 3, further comprising:
a plate frame having a front plate portion with a window through which the front surface of the panel unit is exposed and a peripheral holder piece arranged to surround and hold a peripheral surface of the panel unit extending perpendicular to the front surface thereof, the plate frame being fixed in place to the wall surface; and
a plate cover having a front wall portion that covers the front plate portion and has a cover window through which the front surface of the panel unit is exposed, and a peripheral wall portion arranged to surround the peripheral holder piece of the plate frame, the plate cover being fitted to the plate frame from the front side thereof,
wherein the cover window has a size that allows the panel unit to be fitted in the window with substantially no gap therebetween, and at least one drop-preventing leg is provided on the peripheral surface of the panel unit.

22. The device of claim 21, wherein the drop-preventing lug is provided on the upper and the lower peripheral surface of the panel unit.

23. The device of claim 21, wherein the drop-preventing lug is provided on the left and the right peripheral surface of the panel unit.

24. The device of claim 21, wherein the drop-preventing lug is provided on the upper, the lower, the left and the right peripheral surface of the panel unit.

25. The device of claim 21, wherein the drop-preventing lug is provided along the entire peripheral surface of the panel unit.

26. The device of claim 21, wherein the front surface of the drop-preventing lug is in contact with the rear surface of the front wall portion of the plate cover.

* * * * *